United States Patent
Liesener

(10) Patent No.: US 9,201,313 B2
(45) Date of Patent: Dec. 1, 2015

(54) COMPACT ENCODER HEAD FOR INTERFEROMETRIC ENCODER SYSTEM

(71) Applicant: Zygo Corporation, Middlefield, CT (US)

(72) Inventor: Jan Liesener, Middletown, CT (US)

(73) Assignee: Zygo Corporation, Middlefield, CT (US)

( * ) Notice: Subject to any disclaimer, the term of this patent is extended or adjusted under 35 U.S.C. 154(b) by 249 days.

(21) Appl. No.: 13/672,234

(22) Filed: Nov. 8, 2012

(65) Prior Publication Data

US 2013/0114062 A1 May 9, 2013

Related U.S. Application Data

(60) Provisional application No. 61/557,776, filed on Nov. 9, 2011, provisional application No. 61/557,755, filed on Nov. 9, 2011.

(51) Int. Cl.
*G01B 11/02* (2006.01)
*G01B 11/14* (2006.01)
*G03B 27/54* (2006.01)
(Continued)

(52) U.S. Cl.
CPC ............ *G03F 7/70775* (2013.01); *G01D 5/266* (2013.01); *G01D 5/38* (2013.01); *H01L 21/681* (2013.01)

(58) Field of Classification Search
CPC .. G01D 5/34746; G01D 5/38; G03F 7/70775; H01L 21/68–21/682
USPC ............. 310/12.05, 12.06, 12.19; 355/67, 72, 355/75, 77; 356/399–401, 498–500, 356/614–616
See application file for complete search history.

(56) References Cited

U.S. PATENT DOCUMENTS 4,629,886 A   12/1986 Akiyama et al.
4,895,447 A   1/1990 Jarisch et al.
(Continued)

FOREIGN PATENT DOCUMENTS

CN   1435675     8/2003   ............. G01B 11/00
CN   101676692   3/2010   ............... G01D 5/36
(Continued)

OTHER PUBLICATIONS

International Search Report and Written Opinion dated Mar. 15, 2013, issued in corresponding International Application No. PCT/US2012/064211.
(Continued)

*Primary Examiner* — Colin Kreutzer
(74) *Attorney, Agent, or Firm* — Fish & Richardson P.C.

(57) ABSTRACT

An encoder system includes an encoder scale and an encoder head, in which the encoder head is configured to combine each twice-diffracted measurement beam of multiple twice-diffracted measurement beams with a corresponding reference beam to form multiple output beams, where the encoder head includes a monolithic optical component having multiple facets, the multiple facets being arranged to: receive multiple once-diffracted measurement beams from a surface of the encoder scale; and redirect the multiple once-diffracted measurement beams back towards the surface of the encoder scale, the encoder scale being positioned in a path of the once-diffracted measurement beams to produce the twice-diffracted measurement beams.

31 Claims, 12 Drawing Sheets

(51) Int. Cl.

| | | |
|---|---|---|
| *G03B 27/58* | (2006.01) | |
| *G03B 27/62* | (2006.01) | |
| *H02K 41/02* | (2006.01) | |
| *G03F 7/20* | (2006.01) | |
| *G01D 5/26* | (2006.01) | |
| *G01D 5/38* | (2006.01) | |
| *H01L 21/68* | (2006.01) | |

(56) References Cited

U.S. PATENT DOCUMENTS

| | | | |
|---|---|---|---|
| 5,035,507 | A | 7/1991 | Nishioki et al. |
| 5,442,172 | A | 8/1995 | Chiang et al. |
| 5,483,343 | A | 1/1996 | Iwamoto et al. |
| 5,498,870 | A | 3/1996 | Ishizuka |
| 7,394,550 | B2 | 7/2008 | Takahashi et al. |
| 7,440,113 | B2 | 10/2008 | Trutna, Jr. et al. |
| 7,545,507 | B2 | 6/2009 | Schluchter et al. |
| 8,300,233 | B2 | 10/2012 | Deck et al. |
| 2003/0141441 | A1 | 7/2003 | Kawano et al. |
| 2006/0039006 | A1 | 2/2006 | Van der Pasch |
| 2006/0092428 | A1 | 5/2006 | Holzapfel et al. |
| 2007/0013920 | A1 | 1/2007 | Holzapfel |
| 2007/0051884 | A1 | 3/2007 | Romanov et al. |
| 2007/0146722 | A1 | 6/2007 | Trutna, Jr. et al. |
| 2008/0151229 | A1 | 6/2008 | Hill |
| 2008/0285051 | A1 | 11/2008 | Hill |
| 2008/0304079 | A1 | 12/2008 | Schluchter et al. |
| 2009/0268210 | A1 | 10/2009 | Prince |
| 2010/0072348 | A1 | 3/2010 | Takahashi |
| 2010/0128283 | A1 | 5/2010 | Liesener et al. |
| 2010/0297561 | A1 | 11/2010 | Beerens et al. |
| 2011/0255096 | A1 | 10/2011 | Deck et al. |
| 2012/0032067 | A1* | 2/2012 | Goodwin et al. ............ 250/225 |
| 2012/0154780 | A1 | 6/2012 | Demarest |
| 2012/0194824 | A1 | 8/2012 | de Groot et al. |
| 2013/0128255 | A1 | 5/2013 | Liu |

FOREIGN PATENT DOCUMENTS

| | | | |
|---|---|---|---|
| EP | 0 589 477 | 3/1994 | ............... G01D 5/38 |
| EP | 1837630 | 9/2007 | |
| JP | 2007-10659 | 1/2007 | ............... G01D 5/38 |
| JP | 2007-171206 | 7/2007 | ............... G01B 9/02 |
| JP | 2008-503745 | 2/2008 | ............... G01D 5/26 |
| JP | 2010-38654 | 2/2010 | ............... G01D 5/38 |
| WO | WO 89/05964 | 6/1989 | ............... G01D 5/38 |
| WO | WO 2005/124282 | 12/2005 | ............... G01D 5/00 |
| WO | WO 2011/126610 | 10/2011 | ............... G01D 5/38 |

OTHER PUBLICATIONS

International Search Report and Written Opinion mailed on Mar. 14, 2013 in corresponding International Application No. PCT/US2012/064086.

Gargas, J., et al., "A Versatile XY Stage with a Flexural Six-Degree-of-Freedom Fine Positioner," *Proc. of the 10th Annual Mtg. of the ASPE* 12 (1995): 203-206.

Slocum, Alexander H. *Precision Machine Design*. Englewood Cliffs, NJ: Prentice Hall, 1992. 163-174.

Kao, Ching-Fen, et al. "Diffractive Laser Encoder with a Grating in Littrow Configuration," *Japanese Journal of Applied Physics* 47.3 (2008): 1833-1837.

Wu, Chyan-Chyi, et al. "Optical heterodyne laser encoder with sub-nanometer resolution," *Measurement Science and Technology* 19.4 (2008): 045305 (8 pages).

Slocum, Alexander H. *Precision Machine Design*. Englewood Cliffs, NJ: Prentice Hall, 1992. 176-206.

Japanese Office Action for Japanese Patent Application No. 2014-541271 dated Jul. 7, 2015 (5 pages).

Copy of Search Report from the EPO for Application No. 12 84 7106 by Examiner Michael Stenger, dated Jul. 14, 2015 (3 pages).

* cited by examiner

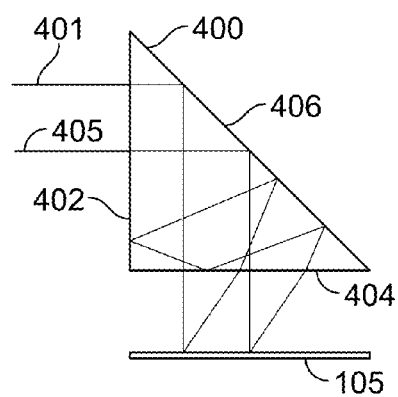 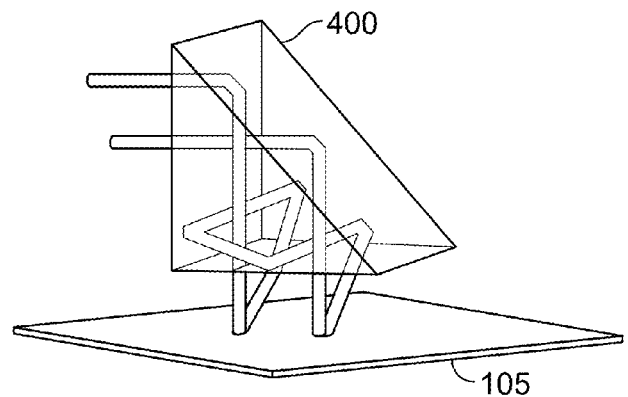
FIG. 4A  FIG. 4B
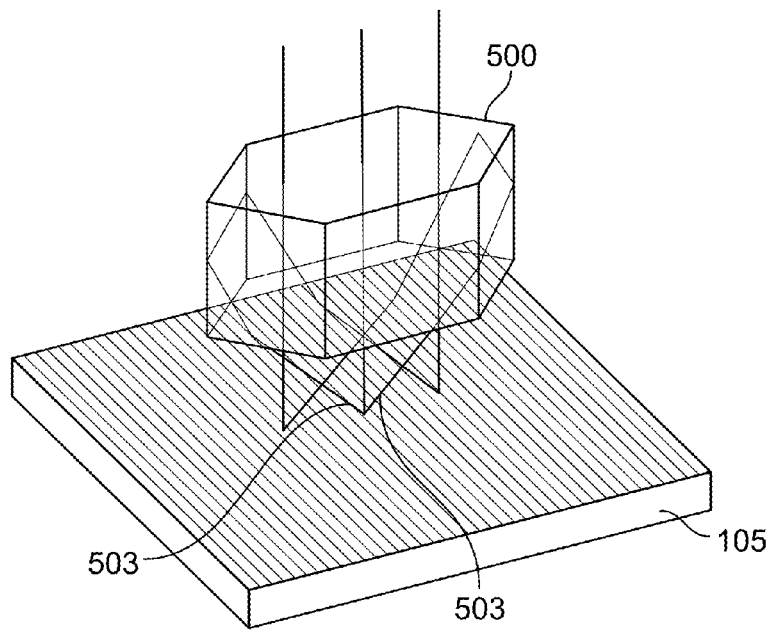
FIG. 5

COMPACT ENCODER HEAD FOR INTERFEROMETRIC ENCODER SYSTEM

CROSS-REFERENCE TO RELATED APPLICATIONS

This application claims priority to Provisional Application No. 61/557,776, filed on Nov. 9, 2011, and Provisional Application No. 61/557,755, filed on Nov. 9, 2011. The content of each of those applications is hereby incorporated by reference in its entirety.

BACKGROUND

In some cases, interferometric measuring systems monitor changes in the relative position of a measurement object based on an optical interference signal. For example, an interferometer generates the optical interference signal by overlapping and interfering a measurement beam reflected from the measurement object with a second beam, sometimes called a "reference beam," where the measurement beam and the reference beam are derived from a common source. Changes in the relative position of the measurement object correspond to changes in the phase of the measured optical interference signal.

Examples of such interferometric measuring systems are interferometric encoder systems, which evaluate the motion of an object by tracking a measuring graduation, called the encoder scale. Typically, an interferometric encoder system includes the encoder scale and an encoder head. The encoder head is an assembly that includes an interferometer. The interferometer directs a measurement beam to the encoder scale, where it diffracts. The interferometer combines the diffracted measurement beam with a reference beam to form an output beam that includes a phase related to the position of the object. Encoder systems are used extensively in lithographic applications for monitoring the motion of moveable stages in a lithography tool. Encoder systems can be advantageous in such applications due to their relative insensitivity to atmospheric turbulence.

SUMMARY

This disclosure relates to compact encoder heads. Various aspects of the invention are summarized as follows.

In general, in a first aspect, the subject matter of the disclosure can be embodied in an encoder head for use with an encoder scale, the encoder head being configured to combine each twice-diffracted measurement beam of multiple twice-diffracted measurement beams with a corresponding reference beam to form multiple output beams, in which the encoder head includes a monolithic optical component having multiple facets, the multiple facets being arranged to: i) receive multiple once-diffracted measurement beams from a surface of the encoder scale; and ii) redirect the multiple once-diffracted measurement beams back towards the surface of the encoder scale, the encoder scale being positioned in a path of the once-diffracted measurement beams to produce the twice-diffracted measurement beams.

In another aspect, the subject matter of the present disclosure can be embodied in an encoder system that includes an encoder scale, an encoder head, the encoder head being configured to combine each twice-diffracted measurement beam of multiple twice-diffracted measurement beams with a corresponding reference beam to form multiple output beams, in which the encoder head includes a monolithic optical component having multiple facets, the multiple facets being arranged to: receive multiple once-diffracted measurement beams from a surface of the encoder scale; and redirect the multiple once-diffracted measurement beams back towards the surface of the encoder scale, the encoder scale being positioned in a path of the once-diffracted measurement beams to produce the twice-diffracted measurement beams. The encoder system further can include multiple detector elements positioned to detect the output beams, and an electronic processor configured to: receive a interference signal from each of the detector elements, each interference signal including a phase related to an optical path difference between one of the twice-diffracted measurement beams and the corresponding reference beam; and determine information about a degree of freedom of the encoder scale based on the phase for each interference signal.

Implementations of the systems can include one or more of the following features and/or features of other aspects. For example, the monolithic optical component can have a cube shape. In some implementations, the monolithic optical component has a rectangular parallelepiped shape.

In some implementations, the monolithic optical component includes a first facet arranged to receive a non-diffracted measurement beam and to emit the twice-diffracted measurement beams. The first facet can be substantially transparent to radiation propagating in a direction normal to the first facet, and substantially reflective to radiation incident at oblique angles with respect to the first facet. The monolithic optical component can include a second facet arranged to receive a once-diffracted or twice-diffracted measurement beam from the encoder scale. The second facet can be substantially transparent to radiation propagating in a direction normal to the second facet. The second facet can be arranged across from and facing the first facet.

Alternatively, the second facet can be arranged orthogonal to the first facet. The second facet can be configured to: reflect radiation incident on the second facet at a first range of oblique angles with respect to the second facet, and transmit radiation incident on the second facet at a second different range of oblique angles with respect to the second facet.

In some implementations, a side facet of the monolithic optical component is substantially reflective to radiation incident at oblique angles with respect to the side facet.

In some implementations, the encoder scale includes a 1D or 2D grating. The grating can be composed of grooves extending along a first direction. In some cases, a plane including a side facet of the monolithic optical component can be oriented at an oblique angle with respect to the first direction.

In some implementations, the monolithic optical component can include a hexagonal prism or a pentagonal prism.

In certain implementations, the encoder head can be configured to direct a non-diffracted measurement along a first beam path toward the encoder scale, the first beam path of the non-diffracted measurement beam being outside of the monolithic optical component. The encoder scale can be positioned with respect to the monolithic optical component to diffract an incident beam along a second beam path, the second beam path of the diffracted incident beam being outside of the monolithic optical component.

In some implementations, the once-diffracted measurement beams include a first once-diffracted measurement beam that results from a positive order of diffraction from the encoder scale and a second once-diffracted measurement beam that results from a negative order of diffraction from the encoder scale. The first and second once-diffracted measurement beams can include positive and negative orders of diffraction within a first plane. The once-diffracted measurement beams further can include third and fourth once-diffracted measurement beams that include a positive order and a negative order of diffraction from the encoder scale, respectively, within a second plane orthogonal to the first plane.

In some implementations, the system further includes multiple optical elements, in addition to configured to receive an input beam, and derive, from the input beam, (1) the corresponding reference beam for each twice-diffracted measurement beam and (2) an incident measurement beam. The multiple optical elements can include multiple beam splitters and a retro-reflector.

In some implementations, the monolithic optical component is configured to receive an input beam, and derive, from the input beam, (1) the corresponding reference beam for each twice-diffracted measurement beam and (2) an incident measurement beam. The monolithic optical component can include a beam splitting facet configured to split the input beam based on a polarization of the input beam and based on a specified angle of incidence with respect to the beam splitting facet, and reflect beams incident on the beam splitting facet at angles of incidence other than the specified angle of incidence. The system can further include a reference grating positioned to receive the reference beams from the monolithic optical component, and redirect diffracted reference beams to the monolithic optical component.

In another aspect, the subject matter of the present disclosure can be embodied in a system including a moveable stage, and an encoder system, in which either the encoder system or the measurement object is attached to the moveable stage. The encoder system can include an encoder scale and an encoder head, in which the encoder head is configured to combine each twice-diffracted measurement beam of multiple twice-diffracted measurement beams with a corresponding reference beam to form multiple output beams. In some implementations, the encoder head includes a monolithic optical component having multiple facets, in which the multiple facets are arranged to receive multiple once-diffracted measurement beams from a surface of the encoder scale, and redirect the multiple once-diffracted measurement beams back towards the surface of the encoder scale. In some implementations, the encoder scale is positioned in a path of the once-diffracted measurement beams to produce the twice-diffracted measurement beams. The encoder system further can include multiple detector elements positioned to detect the output beams, and an electronic processor configured to receive a interference signal from each of the detector elements, in which each interference signal includes a phase related to an optical path difference between one of the twice-diffracted measurement beams and the corresponding reference beam. The electronic processor can be further configured to determine information about a degree of freedom of the encoder scale based on the phase for each interference signal.

In another aspect, the subject matter of the present disclosure can be embodied in a lithography system including an encoder system, a moveable stage, in which either the encoder system or the measurement object is attached to the moveable stage, an illumination system coupled to the encoder system, a detector to detect, during operation of the lithography system, an output beam from the encoder system, and a positioning system coupled to the electronic processor and configured to adjust the position of the stage based on the information about the displacement of an encoder scale. The illumination system can include a radiation source, in which, during operation of the lithography system, the source directs radiation to the encoder system. The encoder system can include the encoder scale, and an encoder head configured to combine each twice-diffracted measurement beam of multiple twice-diffracted measurement beams with a corresponding reference beam to form multiple output beams. The encoder head can include a monolithic optical component having multiple facets, in which the multiple facets are arranged to receive multiple once-diffracted measurement beams from a surface of the encoder scale, and redirect the multiple once-diffracted measurement beams back towards the surface of the encoder scale. The encoder scale can be positioned in a path of the once-diffracted measurement beams to produce the twice-diffracted measurement beams. The encoder system further can include multiple detector elements positioned to detect the output beams, and an electronic processor configured to receive an interference signal from each of the detector elements, in which each interference signal includes a phase related to an optical path difference between one of the twice-diffracted measurement beams and the corresponding reference beam, and determine information about a degree of freedom of the encoder scale based on the phase for each interference signal.

Advantages of the various aspects of the subject matter disclosed herein can include, for example, interferometric encoder systems having a low number of optical elements and/or separate encoder heads required for position measurements. Other advantages include, for example, a low cost and/or simple design for interferometric encoder systems and/or encoder heads.

The details of one or more embodiments are set forth in the accompanying drawings and the description below. Other features and advantages will be apparent from the description, the drawings, and the claims.

BRIEF DESCRIPTION OF THE DRAWINGS

FIG. 4A is a schematic of a cross-section of an example optical component.

FIG. 4B is a 3D schematic of the optical component shown in FIG. 4A.

FIGS. 5-7 are 3D schematics of example optical components.

DETAILED DESCRIPTION

Figure 1:
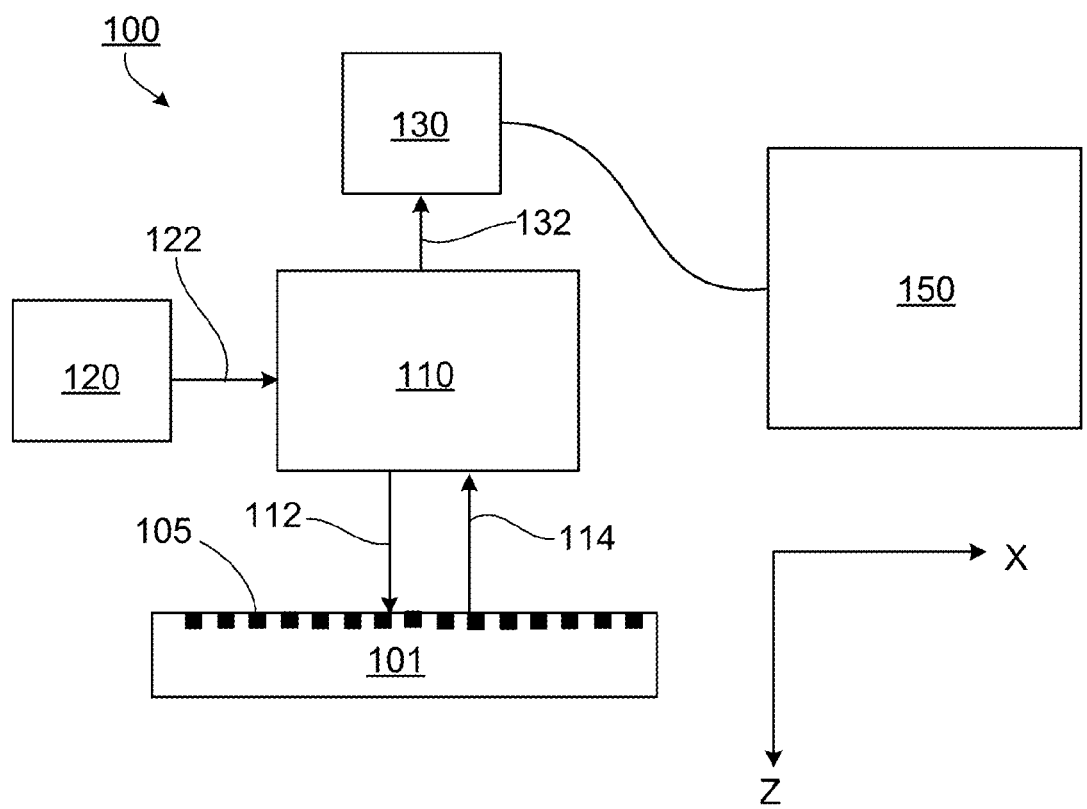
FIG. 1 is a schematic of an example interferometric encoder system.

Referring to FIG. 1, an interferometric encoder system 100 includes a light source module 120 (e.g., including a laser), an optical assembly 110, a measurement object 101, a detector module 130 (e.g., including a polarizer and a photodetector), and an electronic processor 150. Generally, light source module 120 includes a light source and can also include other components such as beam shaping optics (e.g., light collimating optics), light guiding components (e.g., fiber optic waveguides) and/or polarization management optics (e.g., polarizers and/or wave plates). Various embodiments of optical assembly 110 are described below. The optical assembly is also referred to as the "encoder head." A Cartesian coordinate system is shown for reference, in which the Y-direction (not shown) is into the page.

Measurement object 101 is positioned some nominal distance from optical assembly 110 along the Z-axis. In many applications, such as where the encoder system is used to monitor the position of a wafer stage or reticle stage in a lithography tool, measurement object 101 is moved relative to the optical assembly in the X- and/or Y-directions while remaining nominally a constant distance from the optical assembly relative to the Z-axis. This constant distance can be relatively small (e.g., a few centimeters or less). However, in such applications, the location of measurement object typically will vary a small amount from the nominally constant distance and the relative orientation of the measurement object within the Cartesian coordinate system can vary by small amounts too. During operation, encoder system 100 monitors one or more of these degrees of freedom of measurement object 101 with respect to optical assembly 110, including a position of measurement object 101 with respect to the X-axis, and further including, in certain embodiments, a position of the measurement object 101 with respect to the Y-axis and/or Z-axis and/or with respect to pitch and yaw angular orientations.

To monitor the position of measurement object 101, source module 120 directs an input beam 122 to optical assembly 110. Optical assembly 110 derives a measurement beam 112 from input beam 122 and directs measurement beam 112 to measurement object 101. Optical assembly 110 also derives a reference beam (not shown) from input beam 122 and directs the reference beam along a path different from the measurement beam. For example, optical assembly 110 can include a beam splitter that splits input beam 122 into measurement beam 112 and the reference beam. The measurement and reference beams can have orthogonal polarizations (e.g., orthogonal linear polarizations).

Measurement object 101 includes an encoder scale 105, which is, for example, a measuring graduation that diffracts the measurement beam from the encoder head into one or more diffracted orders. In general, encoder scales can include a variety of different diffractive structures such as gratings or holographic diffractive structures. Examples of gratings include sinusoidal, rectangular, or saw-tooth gratings. Gratings can be characterized by a periodic structure having a constant pitch, but also by more complex periodic structures (e.g., chirped gratings). In general, the encoder scale can diffract the measurement beam into more than one plane. For example, the encoder scale can be a two-dimensional grating that diffracts the measurement beam into diffracted orders in the X-Z and Y-Z planes. The encoder scale extends in the X-Y plane over distances that correspond to the range of the motion of measurement object 101.

In the present embodiment, encoder scale 105 is a grating having grating lines that extend orthogonal to the plane of the page, parallel to the Y-axis of the Cartesian coordinate system shown in FIG. 1. The grating lines are periodic along the X-axis. Encoder scale 105 has a grating plane corresponding to the X-Y plane and the encoder scale diffracts measurement beam 112 into one or more diffracted orders in the Y-Z plane.

At least one of these diffracted orders (e.g., a +1 or −1 diffraction order) of the measurement beam (labeled beam 114), returns to optical assembly 110, where optical elements are used to combine the diffracted measurement beam with the reference beam to form an output beam 132. Alternatively, optical elements within the assembly 110 are used to redirect the diffracted measurement beam back to the encoder scale to diffract a second time prior to combining with the reference beam.

Output beam 132 includes phase information related to the optical path length difference between the measurement beam and the reference beam. Optical assembly 110 directs output beam 132 to detector module 130 that detects the output beam and sends a signal to electronic processor 150 in response to the detected output beam. Electronic processor 150 receives and analyzes the signal and determines information about one or more degrees of freedom of measurement object 101 relative to optical assembly 110. An example of an exemplary technique for determining information about one or more degrees of freedom based on detected output beams can be found in U.S. Pat. No. 8,300,233, incorporated herein by reference in its entirety.

In certain embodiments, the measurement and reference beams have a small difference in frequency (e.g., a difference in the kHz to MHz range) to produce an interferometry signal of interest at a frequency generally corresponding to this frequency difference. This frequency is hereinafter referred to interchangeably as the "heterodyne" frequency. Information about the changes in the relative position of the measurement object generally corresponds to a phase of the interferometry signal at this heterodyne frequency. Signal processing techniques can be used to extract this phase. In general, the moveable measurement object causes this phase term to be time-varying. In this regard, the first order time derivative of the measurement object movement causes the frequency of the interferometry signal to shift from the heterodyne frequency by an amount referred to herein as the "Doppler" shift.

The different frequencies of the measurement and reference beams can be produced, for example, by laser Zeeman splitting, by acousto-optical modulation, using two different laser modes, or internal to the laser using birefringent elements, among other techniques. Orthogonal polarizations allow a polarizing beam-splitter to direct the measurement and reference beams along different paths, and combine them to form the output beam that subsequently passes through a polarizer, which mixes the orthogonally polarized components so they can interfere. In the absence of target motion the interference signal oscillates at the heterodyne frequency, which is just the difference in the optical frequencies of the two components. In the presence of motion the heterodyne frequency incurs a change related to the velocity of the target through well-known Doppler relations. Accordingly, monitoring changes in the heterodyne frequency allows one to monitor motion of the target relative to the optical assembly.

In the embodiments described below, the "input beam" generally refers to the beam emitted by the light source module. For heterodyne detection, the input beam includes components having slightly different frequencies, as discussed above.

In certain embodiments, the interferometer systems are designed so they do not operate at Littrow. For example, the measurement beam is incident on measurement object 101 at an incident angle such that the once-diffracted measurement beam does not satisfy the Littrow condition. The Littrow condition refers to an orientation of a diffractive structure, such as a grating, with respect to an incident beam where the diffractive structure directs the diffracted beam back towards the source. In other words, in encoder system 100, the once-diffracted measurement beam does not satisfy the Littrow condition because the once-diffracted measurement beam is non-co-linear with the measurement beam prior to diffracting at the encoder scale.

While encoder scale 105 is depicted in FIG. 1 as a structure that is periodic in one direction, more generally, the measurement object can include a variety of different diffractive structures that appropriately diffract the measurement beam. In some embodiments, the measurement object can include a diffractive structure (e.g., a encoder scale) that is periodic in two directions (e.g., along the X- and Y-axis), diffracting the measurement beam into beams in two orthogonal planes. In general, the diffractive structure of the encoder scale and source module are selected so that the encoder system provides one or more diffracted measurement beams having sufficient intensity to establish one or more detectable interference signals when combined with corresponding reference beams, within the geometrical constraints for the system. In some embodiments, the source module provides an input beam having a wavelength in a range from 400 nm to 1,600 nm. For example, the input beam can have a wavelength of about 633 nm or about 980 nm. Note that, in general, the frequency splitting of the heterodyne source results in only a very small difference between the wavelength of the two components of the input beam, so even though the input beam is not strictly monochromatic it remains practical to characterize the input beam by a single wavelength. In some embodiments, the source module can include a gas laser (e.g., a HeNe laser), a laser diode or other solid-state laser source, a light-emitting diode, or a thermal source such as a halogen light with or without a filter to modify the spectral bandwidth.

In general, the diffractive structure (e.g., grating pitch) can vary depending on the wavelength of the input beam and the arrangement of optical assembly and diffracted orders used for the measurement. In some embodiments, the diffractive structure is a grating having a pitch in a range from about $1\lambda$ to about $20\lambda$, where $\lambda$ is a wavelength of the source. The grating can have a pitch in a range from about 0.5 μm to about 10 μm. Further embodiments of interferometric optical encoder systems and operation can be found in U.S. Pat. No. 8,300,233, the contents of which are incorporated herein by reference in their entirety.

As explained above, the measurement object diffracts the incident measurement beam into beams in one or more planes (e.g., two orthogonal planes). These diffracted beams can include, for example, beams resulting from positive orders of diffraction and beams resulting from negative orders of diffraction. In some implementations, the diffracted beams are combined with a corresponding reference beam to form multiple output beams, in which multiple components are used to deliver the beam to the encoder scale, receive the once-diffracted beams from the encoder scale, redirect the once-diffracted beam(s) toward the encoder scale to be diffracted a second time, and receive the twice-diffracted beams. Such systems can have complex arrangements and require high construction and fabrication costs due to the number of components required to receive and redirect each of the diffracted beams.

To reduce the system cost, simplify the system design, and increase efficient use of light energy the multiple components used to receive and redirect the diffracted measurement beams can be replaced with a monolithic optical component having two or more substantially retro-reflective combinations of optical surfaces. In some implementations, the once-diffracted beams enter the monolithic optical component and are redirected by the surfaces and/or facets of the monolithic optical component back onto the diffraction grating where two or more twice-diffracted beams are produced. In some implementations, the surfaces and/or facets of the monolithic optical component are configured to derive the measurement beam from an input beam and redirect the measurement beam to the encoder scale to obtain the once-diffracted measurement beam. The twice-diffracted beams can interfere with each other or with corresponding reference beams to produce output beams that are recorded by detectors. Interference signals obtained from the detectors then can be used to determine position information about the grating position based on phase information from the interference signals. At least N measurement beams are required to measure the change of position of the encoder scale in N dimensions. Compared to designs that require multiple separate input beams, of which a single diffracted order is detected for each input beam, the systems disclosed herein can use a single input beam to derive the different diffracted orders and thus provide an efficient use of source light. Thus, in some implementations, the power necessary to perform measurements can be reduced. Alternatively, in some implementations, position measurements can be performed with lower noise.

Similarly, in some implementations, the surfaces and/or facets of the monolithic optical component are configured to receive and redirect once-diffracted and/or twice-diffracted reference beams from a reference grating. In some cases, the surfaces and/or facets of the monolithic optical component are configured to derive the reference beam prior to diffraction from an input beam.

For the purposes of this disclosure, monolithic optical component is understood to mean an optical device that includes one or more optical elements constituting a single contiguous component. In some implementations, the single component can be formed without joints or seams. In some implementations, the single component can include a facet that extends through at least a portion of the component, in which the facet is formed by fusing or adhering two separate optical elements together into a single contiguous component (e.g., using an optical adhesive). For example, the single component can include a polarizing beam splitter that has a facet extending through the beam splitter body for splitting an incident beam composed of orthogonal polarizations into two separate beams propagating in different directions, based on the different polarizations of the input beam.

Although a single monolithic optical component can be used to receive and redirect diffracted measurement and/or reference beams, implementations are also possible where the monolithic optical component is arranged in conjunction with one or more beam steering, beam splitting and/or beam combining components, to provide a compact optical arrangement for determining a relative change in position of an encoder scale in N dimensions.

The minimalistic optical design for an optical encoder head can make use of the multiple retro-reflecting elements that come with any single cube, cuboid (six-sided body with rectangular surfaces), right-angle prism (e.g., prisms having 45°, 45° and 90° included angles or 30°, 60°, and 90° included angles) or any other monolithic component having multiple retro-reflective combinations of optical surfaces. The embodiments disclosed herein can be used to capture and evaluate 2 or 4 diffraction orders of a 1D or 2D grating, respectively, and thus can provide improved efficiency compared to designs that capture less than the 2 or 4 diffraction orders. In addition, each of the embodiments described herein is compatible with both homodyne and heterodyne illumination sources.

In an example embodiment, four diffracted measurement beams can be controlled using a single monolithic glass cube and an encoder scale (e.g., a 2D diffraction grating). Upon delivery of an input measurement beam to the glass cube, the input measurement beam passes through the cube, impinges on the encoder scale at a non-Littrow angle and is split into at least 4 first diffraction orders (e.g., +1 and −1 within a first plane and +1 and −1 within a second orthogonal plane). The four diffracted beams reenter the cube and are retro-reflected near four of the cube's corners, and return to the encoder scale where the beams are again diffracted at non-Littrow angle, four of which are spatially separated and propagate in a direction opposite that of the initial input beam. The twice-diffracted beams pass through the cube and are ready to interfere with one or more reference beams. The foregoing arrangement provides four phase measurements and therefore allows for the calculation of the position of the encoder head or the encoder scale in all 3 dimensions with some redundancy.

Figure 2A:
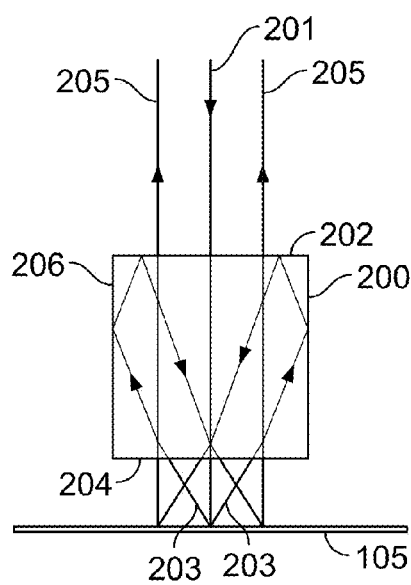
FIG. 2A is a schematic of a cross-section of an example optical component.

FIG. 2A is a schematic of a cross-section of an example monolithic optical component 200 similar to the example embodiment described above and for use in an encoder head of an interferometric encoder system. The optical component 200 is arranged to receive multiple once-diffracted beams from an encoder scale 105 and redirect the once-diffracted beams back to the encoder scale. For ease of viewing, other components of the interferometric encoder system are omitted from the figure. The optical component 200 includes a monolithic cube having a top facet 202, a bottom facet 204 and four side facets 206. The encoder scale 105 includes a 2D grating.

During operation of the interferometric encoder system, a measurement beam 201 derived from an illumination source is incident on the top facet 202 of the optical component 200, in which the measurement beam 201 is normal to a surface of the facet 202. The measurement beam 201 passes through the top facet 202 and through the bottom facet 204 to the encoder scale 105 at a non-Littrow angle. Due to the diffractive properties of the encoder scale 105, the measurement beam 201 is diffracted into multiple diffraction orders. The diffracted beams correspond, for example, to one or more first beams resulting from positive orders of diffraction from the encoder scale and one or more second beams resulting from negative orders of diffraction from the encoder scale 105. For example, the encoder scale 105 diffracts the measurement beam 201 into two beams (e.g., +1 and −1 diffractive orders) propagating within the X-Y plane and two beams propagating (e.g., +1 and −1 diffractive orders) within the Y-Z plane.

The once-diffracted beams 203 return back to the optical component 200 where the beams re-enter the component 200 through the bottom facet 204. The once-diffracted beams 203 then are reflected by the side facets 206 and the top facet 202 of the optical component 200 back towards the bottom facet 204. The once-diffracted beams 203 pass through the bottom facet 204 towards the encoder scale 105, where the measurement beams are diffracted for a second time under a non-Littrow condition. The twice-diffracted beams 205 then return toward the optical component 200 in a direction substantially opposite to the direction of the incident beam 201. After passing through the optical component 200, each of the twice-diffracted beams 205 is combined with a corresponding reference beam (omitted for clarity) to form a corresponding output beam that is received by a detector module (e.g., a polarizer and a photodetector). An electronic processor coupled to the detector analyzes an interference signal from each detector to extract phase information relating to a relative position of the encoder scale and/or the encoder head.

In the example shown in FIG. 2A, the top facet 202 is configured to allow transmission of radiation that is normally incident on a surface of the facet 202 while reflecting radiation incident on the surface of the facet 202 at angles oblique with respect to the facet surface. This property of the top facet 202 can be established using multilayer coatings (e.g., multiple alternating layers of different thin film material) on the facet. By manipulating the thickness and composition of each layer in the multilayer stack, the reflection characteristics can be tuned to particular angles of incidence. That is, the coating can be optimized to have anti-reflection properties for radiation that is normal incident radiation and high reflectivity for radiation incident at one or more oblique angles with respect to the surface of the facet 202. For example, if all oblique beams impinging on the top facet 202 have the same angle of incidence with respect to the facet surface, the layer thicknesses of a multilayer coating at a given angle of incidence and wavelength can be designed to behave similar to a reflective quarter wave stack for the oblique beams and similar to a transmissive half wave stack for normal incident beams. The angular dependence of the surface reflectivity is a consequence of the changing optical path length differences between reflections off the various layer-to-layer interfaces.

For coatings configured to maximize transmission of beams at normal incidence, the coatings can have an incident beam angle tolerance within up to approximately +/−10° from normal. For coatings configured to maximize reflectance of oblique beams (i.e., beams that are non-normal and non-parallel to an incident surface), the coatings can have an incident beam tolerance of about +/−2° to about +/−5° from the desired angle. For a coating that is substantially transmissive to an incident beam at a particular angle, the coating can allow at least 75% (e.g., at least 80%, at least 85%, at least 90%, at least 95%, at least 98%, or at least 99%) of the incident beam to pass. For a coating that is substantially reflective to an incident beam at a particular angle, the coating can reflect at least 75% (e.g., at least 80%, at least 85%, at least 90%, at least 95%, at least 98%, or at least 99%) of the incident beam at the specified angle. Materials for such coatings can include, for example, zinc sulfide, titanium dioxide, magnesium fluoride, and/or silicon dioxide. An example multilayer coating that reflects only 1.2% of a normal beam and 95.2% of an oblique beam at 27.82° within a BK7 glass is the stack ABCBCBCBA, where A is a 57 nm layer of Magnesium Fluoride, B is a 942 nm layer of Zink Sulfide and C is a 1149 nm layer of Magnesium Fluoride. Additional guidance on how to design such multilayer films can be found, for example, in E. Hecht, "Optics", 4th edition, Addison Wesley, 2003, the content of which is incorporated herein by reference in its entirety. The multilayer coatings can also be used in other embodiments, including the examples described below.

In contrast to the top facet 202, the bottom facet 204 is configured to allow transmission of incident radiation that is normal or oblique with respect to the bottom facet surface. In some implementations, to enhance transmission through the bottom facet 204, the facet 204 is configured to include a multilayer coating for wide angles of incidence. Alternatively, the bottom facet 204 can be configured to include a multilayer coating optimized for specific angles of incidence (e.g., normally incident and incident at a single oblique angle) and a particular wavelength or range of wavelengths. The side facets 206 are naturally reflective due to total internal reflection (i.e., the region outside of the component 200 has a refractive index less than the region internal to the component 200). However, the side facets 206 also can be configured to include highly reflective coatings.

Figure 2B:
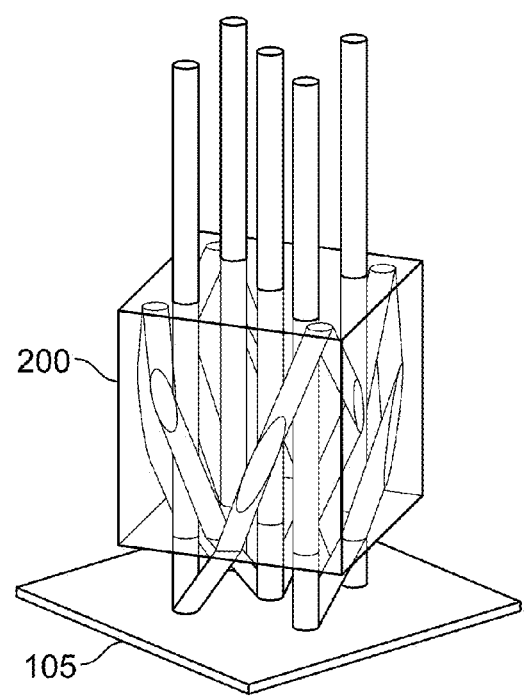
FIG. 2B is a three-dimensional (3D) schematic of the optical component shown in FIG. 2A.
Figure 2C:
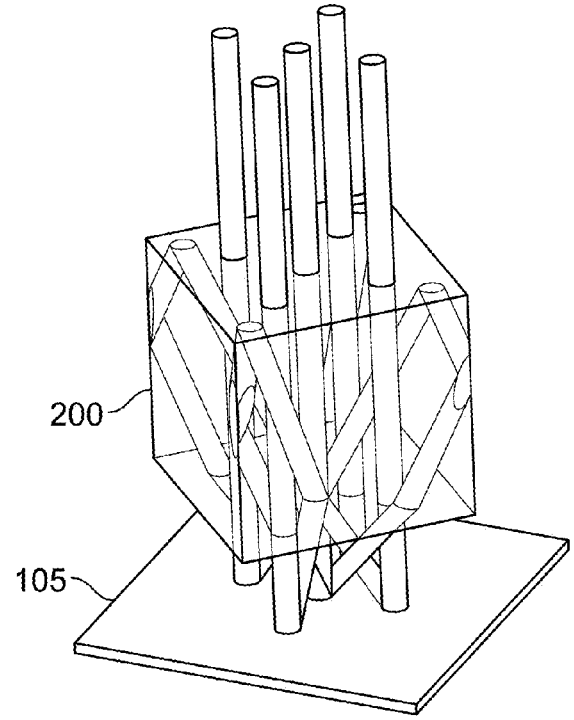
FIG. 2C is a 3D schematic of an example optical component.

FIG. 2B and FIG. 2C are three-dimensional (3D) schematics of the optical component 200 shown in FIG. 2A. As illustrated in FIG. 2B and FIG. 2C, the optical component 200 is oriented so that the bottom edges of the side facets 206 are not aligned with the edges of the encoder scale 105. In the present examples, the encoder scale 105 includes a grating composed of a set of grooves that extend along a direction parallel with at least two edges of the shown section of the encoder scale 105. By rotating the optical component 200 so that the bottom edges of side facets 206 are at an oblique angle with respect to the encoder scale edges, and thus oblique with respect to the direction along which the grooves extend, it is possible to ensure that the once-diffracted beams propagate roughly towards the corners of the optical component 200 where retro-reflection takes place. While FIG. 2B shows the more general case of possible rotation angles of optical component 200 with respect to the encoder grating lines, the angle is a straight 45° in FIG. 2C. That is, after passing through the bottom facet 204, the once-diffracted beams 203 propagate towards edges formed by the intersections of the side facets 206 with one another. As a result, some symmetries in polarization properties and beam paths between various beams can be preserved.

Figure 3A:
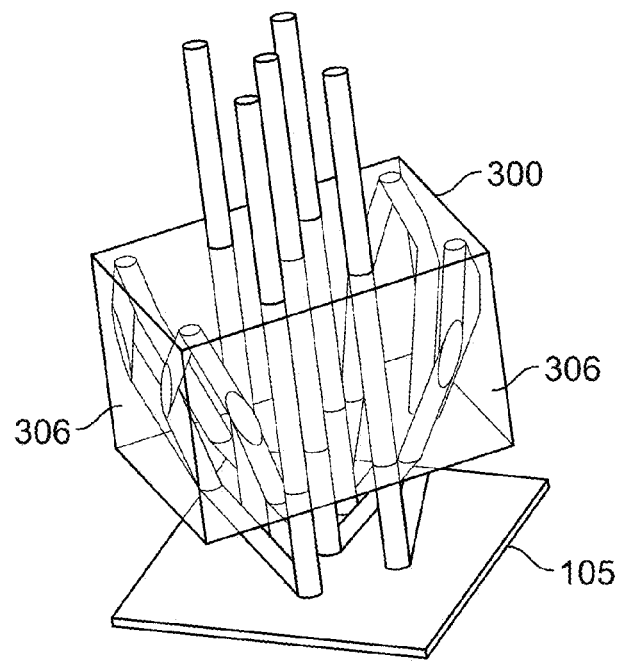
FIGS. 3A and 3B are 3D schematics of an example monolithic optical component.
Figure 3B:
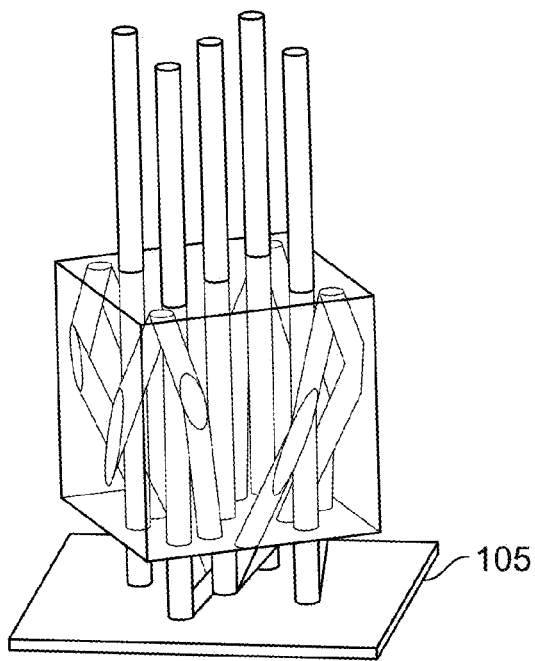

In some embodiments, the optical component can be configured to prevent the once-diffracted beams from impinging on the edges formed by the intersection of side facets with one another, while preventing at least some once-diffracted beams from being incident on such edges. FIG. 3A is a 3D schematic of an example monolithic optical component 300 that prevents diffracted beams from impinging on edges formed by the intersection of side facets 306. To achieve this effect, the optical component 300 is configured to be a rectangular cuboid that is oriented at 45° with respect to a grating direction (i.e., a direction along which an elongated portion of a grating extends) of the encoder scale 105. FIG. 3B is a 3D schematic of a cube rotated with respect to a grating direction by 30° such that the once-diffracted beams are prevented from hitting facet edges.

Other components of the interferometry system and reference beams are omitted for clarity in FIG. 3. As with the optical component 200 in FIG. 2, the optical component 300 can be formed of glass and can include multilayer coatings on different facets to enhance transmission of incident radiation at specified angles and/or to enhance reflection of incident radiation at different specified angles. In some implementations, the component 300 or component 200 can alternatively be configured to have an increased a spatial separation between beams incident on the facet surfaces. Each separated beam then can be directed toward a different region of the optical component 300 or 200 (e.g., toward a facet or side of the optical component 300 or 200). Enabled by the physical separation, the facet or side on which each separated beam is incident can include a corresponding localized reflective or transmissive coating for the beam. By increasing the spatial separation between beams, the localized anti-reflection/transmissive coatings formed on the optical component also can be spaced further apart, thus reducing the complexity of fabricating different coatings close to one another. To obtain the spacing between beams that would allow application of localized coatings, various parameters can be adjusted including, for example, an aspect ratio of the optical component, a distance between the encoder scale 105 and the optical component 300 or 200, a pitch between grooves of a grating in the encoder scale 105, and/or a rotation of the grating direction of an encoder scale 105 with respect to the optical component.

In some embodiments, it is advantageous to deliver and detect a measurement beam along a direction parallel to a plane that contains the encoder scale 105. FIG. 4A is a schematic of a cross-section of an example optical component 400 for receiving a measurement beam 401 propagating along a direction parallel to a plane that contains the encoder scale 105, re-directing the measurement beam 401 toward the encoder scale, and outputting multiple twice diffracted measurement beams 405 along the direction parallel to the plane that contains the encoder scale 105. The shape of optical component 400 corresponds to a monolithic triangular prism. For purposes of clarity, other optical elements of the interferometry system are omitted from FIG. 4A and only a single twice-diffracted beam is shown. However, the optical component 400 can re-direct multiple twice-diffracted beams, in which the twice diffracted beams include one or more first beams that result from positive orders of diffraction from the encoder scale 105 and one or more second beams that result from negative orders of diffraction from the encoder scale 105. As shown in FIG. 4, the measurement beams incident on the encoder scale 105 do not satisfy the Littrow condition.

The optical component 400 can be formed of any suitable material that is substantially transparent to the wavelength of the measurement beam (e.g., glass for light in the visible wavelength range) and includes a first facet 402 for receiving the incident measurement beam 401 and for transmitting twice-diffracted measurement beams 405. The first facet 402 also can include a thin-film multilayer coating (not shown) configured to reflect radiation incident at oblique angles with respect to the facet surface. A second facet 404 can include a thin-film multilayer coating configured to allow transmission or reflection of incident radiation depending on the angle of incidence. For example, as shown in FIG. 4A, the second facet 404 may include a thin-film multilayer coating (not shown) that maximizes transmission for radiation normal to the surface of the second facet 404 and incident at a first oblique angle. However, the second facet 404 reflects, radiation incident on the facet surface at a second oblique angle that is different from the first, enabled either by the multilayer coating or by the phenomenon of total internal reflection. A third facet 406 includes a thin-film coating (not shown) configured to substantially reflect radiation at any angle on its surface. For example, the thin-film coating on third facet 406 can include a thin-film layer or layers of silver or gold.

FIG. 4B is a 3D schematic of the optical component 400. In some implementations, the component 400 is rotated with respect to a grating direction of the encoder scale 105. For example, a bottom edge of component 400 formed by the intersection of the side facet 406 and facet 404 can be rotated to be non-parallel with a groove direction of gratings (e.g., non-parallel with the direction along which the elongated portion of the groove extends). Rotating the optical component 400 to be non-parallel with the gratings can, in some implementations, ensure that the once-diffracted beams propagate roughly towards the corners of the optical component 400.

In some embodiments, the monolithic optical component can be configured to work with encoder scales having a one-dimensional (1D) pattern, such as 1D gratings. FIG. 5 is a 3D schematic of an optical component 500 for use in an encoder head of an interferometric encoder system, in which the optical component 500 is arranged to receive multiple once-diffracted beams from an encoder scale 105 having a 1D grating, and redirect the once-diffracted beams back to the encoder scale 105. In the implementation shown in FIG. 5, the once-diffracted beams 503 received by the component 500 include beams resulting from both positive and negative orders of diffraction along a single plane. The optical component 500 is a monolithic hexagonal prism and can be formed of material substantially transparent to the wavelength of the measurement beam (e.g., glass for a measurement beam in the visible wavelength range). Essentially, the shape of the prism shown in FIG. 5 is defined by the planes of a cuboid prism that are crossed by and/or reflect the measurement beam (including the incident measurement beam and the once and twice-diffracted measurement beams), in which the portions of a cuboid that are not crossed by or reflect the measurement beam are removed.

Figure 6:
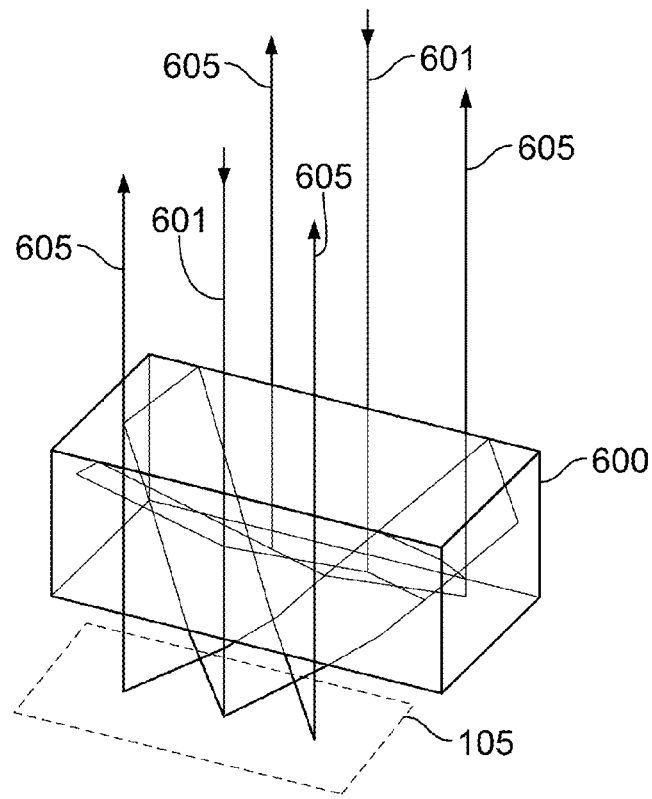

In the examples shown in FIGS. 2-5, the incident measurement beam and twice-diffracted beams travel through the monolithic optical component. In some embodiments, however, those beams may travel to and from the encoder scale 105 without propagating through the optical component. FIG. 6 is a 3D schematic of an optical component 600 in which both the incident measurement beams 601 and the twice-diffracted measurement beams do not propagate through the component 600. Other components of the interferometry encoder system and reference beams are omitted for clarity.

As illustrated in FIG. 6, the incident measurement beams 601 propagate toward the encoder scale 105 outside of the component 600. The once-diffracted beams resulting from the diffraction of each measurement beam at the encoder scale 105 then propagate into the component 600 where they are re-directed by reflection off the facets of the component 600 back towards the encoder scale 105 and diffracted a second time without satisfying the Littrow condition. The twice-diffracted beams 605 then propagate in a direction that is substantially parallel and opposite to the incident measurement beams 601 without passing through the optical component 600. An advantage of the configurations in which the incident and twice-diffracted beams do not pass through the monolithic optical component, such as the component 600 shown in FIG. 6, is that one or more surfaces of the optical component that are used only for reflection can be configured to have a high reflectivity. Since there is no need to allow beams to pass through these surfaces, the surfaces can be formed to have highly reflective coatings, thus increasing the efficiency with which light is reflected. With an increase in the amount of reflected light, the signal(s) ultimately detected at the photodetector module may be improved.

In some embodiments, the shape of the monolithic optical component having the transmissive/reflective facets deviates from a cuboid or right angle prism geometry. The optical component 700, discussed below, is an example of such a component. In some cases, these other shapes also can be used to extract differential phase information. That is, the optical component can be configured to cause multiple measurement beams to interfere with one another, thus eliminating the need to derive separate reference beams from an illumination source. Encoder position information is then based on a phase of the interfering beam, in which the phase relates to an optical path difference (OPD) between the measurement beams.

Figure 7:
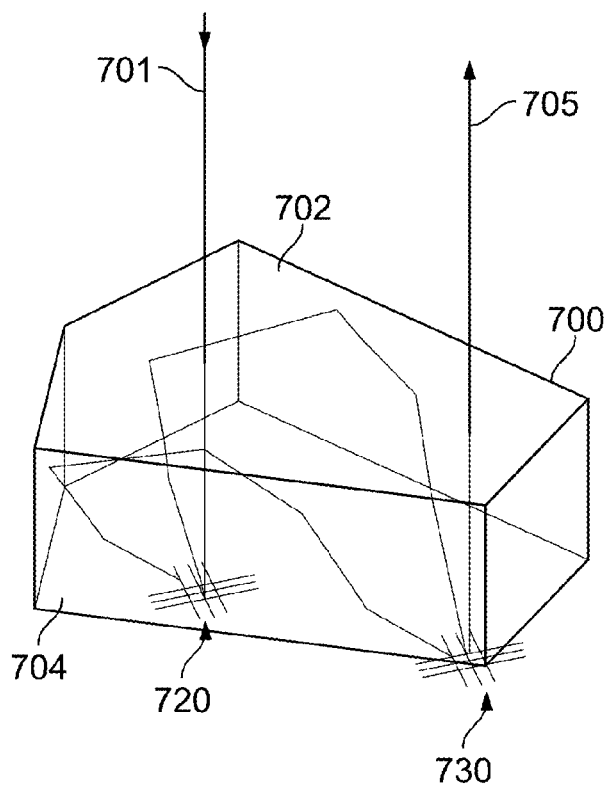

FIG. 7 is a 3D schematic of an example monolithic optical component 700 that is configured to cause multiple measurement beams to combine and interfere so as to produce an output beam from which phase information, and thus position information relating to an encoder scale, can be extracted. For clarity, other components of the interferometry system are omitted from FIG. 7. In the present example, the optical component 700 has a shape corresponding to a pentagonal prism and can be formed of glass.

During operation, an incident measurement beam 701 propagating along a direction normal to a surface of top facet 702 traverses through the top facet 702 and a bottom facet 704 of the component 700. The incident beam 701 is diffracted by the encoder scale (which includes diffraction grating lines) at a first position 720 without satisfying the Littrow condition to produce multiple diffracted beams corresponding to different orders of diffraction of the incident measurement beam 701. For example, the encoder scale diffracts the measurement beam 701 into two beams propagating within a first plane and two beams propagating within a second orthogonal plane. For clarity, only two of the diffracted beams produced at the first position 720 are shown, in which each of the once-diffracted beams propagates within a different plane. The once-diffracted beams are re-directed by the facets of the optical component 700 so that they are both incident on a second position 730 of the encoder scale, where the second position 730 is different from the first position. At the second position 730, the once-diffracted measurement beams are diffracted again without satisfying the Littrow condition such that the twice-diffracted beams 705 propagate along a direction parallel and opposite to the direction of the incident measurement beam 701. The twice-diffracted beams 705 are also collinear such that they interfere upon reaching the detector module of the interferometry system (not shown). Upon receiving the interfering twice-diffracted beams 705, the detector module can produces an electronic interference signal. An electronic processor coupled to the detector module analyzes the interference signal to extract phase information from which a position of the encoder scale relative to the encoder head (i.e., the monolithic optical component) can be determined.

Various embodiments of an interferometric encoder system employing the monolithic optical component are possible. For example, in some embodiments, the interferometric encoder system can include beam splitting components (e.g., polarizing and non-polarizing beam splitters), beam steering components (e.g., mirrors, lenses, prisms, retro-reflectors), and/or polarization management components in addition to the monolithic optical component. The additional beam splitting and/or beam steering elements provide a fixed number of reference beams at specified locations for combining with the diffracted measurement beams obtained using the monolithic optical component. For example, in some embodiments, beam combining components can be used to combine one or more twice-diffracted measurement beams with one or more reference beams, respectively, so that the combined beams interfere at a detector module. In some embodiments, the beam splitting components and/or beam steering components can be arranged so that the measurement and reference beams remain parallel with one another even in the presence of an angular misalignment of the initial source input beam. In some embodiments, one or more diffraction gratings in addition to the encoder scale can be used to diffract the reference beam back towards the monolithic optical component. The use of additional gratings can, in some implementations, provide for compact interferometric encoder system designs since gratings in general are very space-efficient means of generating multiple beams from one beam (see, e.g., FIG. 9).

The beam-splitting combining components disclosed herein can also include, for example, beam-splitting elements such as polarizing or non-polarizing beam-splitting prisms. Other beam-splitting elements also can be used such as, for example, a half-silvered mirrors, or dichroic mirror prisms. The beam steering components disclosed herein can include retro-reflectors, such as cube corner reflectors, and/or prisms, such as right-angled triangular prisms. Examples of polarization changing elements disclosed herein include, but are not limited to, linear polarizers, quarter wave-plates and half-wave plates.

Figure 8:
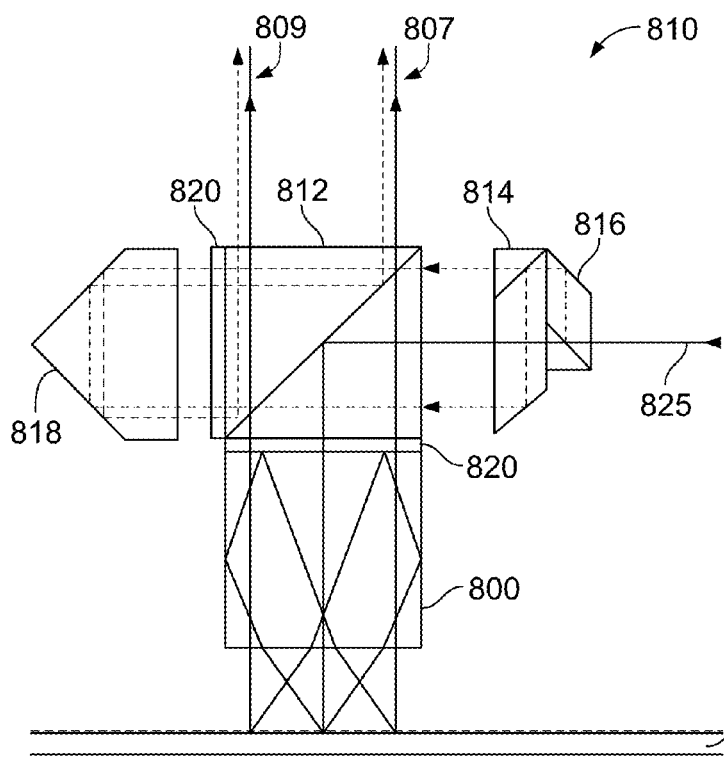
FIGS. 8-9 are schematics of an example interferometric encoder head.

FIG. 8 shows an embodiment of an interferometric encoder system that includes beam-steering and beam-combining components in addition to a monolithic optical component for obtaining twice-diffracted measurement beams. In particular, FIG. 8 is a schematic showing a cross-sectional view of an interferometric encoder head 810 that includes a monolithic optical component 800 for receiving multiple diffracted beams from an encoder scale, a first beam splitter/combiner component 812, a second beam splitting component 814, a third beam splitting component 816, and a retro-reflector 818. In some implementations, the encoder head also includes polarization management components 820 (e.g., quarter wave-plates (QWP), half-wave plates, or polarization rotators).

In certain embodiments, the polarization state of the beams may be generally elliptical after a beam has been twice diffracted off the grating, made multiple passes through air-glass interfaces, and has undergone multiple internal reflections from uncoated and coated surfaces of the monolithic optical component or other optical elements in the interferometer system. In some cases, those polarization changes can eventually decrease the efficiency of the overall interferometer system and/or decrease the accuracy of position detection, given that less light reaches the detector module. Polarizing elements such as polarization management components 820 can be added to the encoder head arrangements and positioned to compensate for the polarization changes. The compensating elements can be placed between the monolithic optical component (e.g., the cuboid or right angle prism) and the encoder scale (and/or reference grating), and/or on surfaces that are part of the retro-reflectors. For example, as shown in FIG. 8, the encoder head 810 includes a first QWP 820a on a first surface of the beam-splitting component 812 and a second QWP 820b on a second surface of the beam-splitter 812. The first QWP 820a is arranged between the beam-splitting component 812 and the retro-reflector 818, whereas the second QWP 820b is arranged between the beam-splitting component 812 and the monolithic optical component 800.

During operation of an interferometric encoder system that employs the encoder head 810, an input beam 825 is provided to the third beam splitting component 816 from an illumination source. The third beam splitter 816 splits the input beam 825 into a measurement beam (solid line) and a reference beam (dashed line). For example, the beam splitter 816 can include a polarizing beam splitter that separates an input beam composed of orthogonally polarized beam components (e.g., s and p polarized beam components) into reference and measurement beams based on a difference in polarizations of the reference beam and measurement beam. The reference beam and measurement beams both pass into the second beam splitting component 814.

The measurement beam passes through the second beam splitting component 814 without modification to the first beam splitting component 812, where the measurement beam is then redirected at a beam-splitting interface toward the monolithic optical component 800 and the encoder scale 105. Using the optical component 800, the measurement beam is diffracted multiple times at non-Littrow angles to produce two or more twice-diffracted measurement beams.

On the other hand, the reference beam interacts with a beam splitting interface of the second beam-splitting component 814 and is divided into two separate reference beams. Both reference beams produced by component 814 pass through the first beam splitting component 812 with little or no reflection towards the retro-reflector 818. The retro-reflector 818 redirects each reference beam back toward the first beam splitting component 812, where each reference beam then is combined with a corresponding twice-diffracted measurement beam to produce separate output beams 807, 809. As shown in FIG. 8, two output beams 807, 809 exit the first beam splitting component 812. If the encoder scale 105 includes a 2D grating, the encoder head arrangement shown in FIG. 8 may be used to produce additional output beams that propagate in a direction out of the plane of the figure. In that case, additional beam splitting elements would have to be used to create the additional reference beams as well. An advantage of the configuration shown in FIG. 8 is that the measurement and reference beams remain parallel to one another within each output beam, even if there is angular misalignment of the initial input beam. This is because the measurement beams, as well as the reference beams, undergo one retro-reflection within each of components 800 and 818, which leads to a condition in which all output beam angles change by the same amount as the input beam angle.

Figure 9:
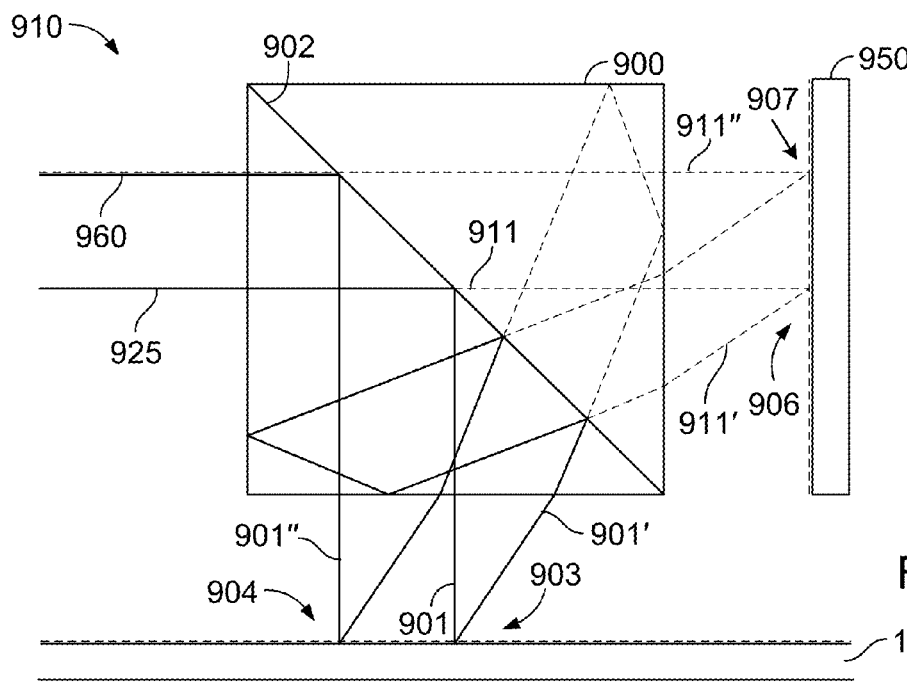

FIG. 9 is a schematic of an example interferometric encoder head 910 that includes a monolithic optical component 900 and a reference grating 950. The optical component 900 can include, for example, a polarizing beam splitting component configured to derive a measurement beam 901 and a reference beam 911 from an input beam 925 provided by an illumination source, in which the input beam 925 is composed of orthogonally polarized beam components. After reflecting off the beam-splitting interface 902, the measurement beam 901 propagates toward the encoder scale 105, where the beam 901 is diffracted, at a non-Littrow angle, into multiple diffraction orders (e.g., +1, −1 diffraction orders) at a first location 903 of the encoder scale. For purposes of clarity, only a single diffracted beam is shown at the first location 903 in FIG. 9.

The multiple once-diffracted measurement beams (e.g., 901') then propagate back toward the monolithic optical component 900. Within the optical component 900, the once-diffracted measurement beams are reflected off the central facet 902 as well as one or more side facets of component 900 until the once-diffracted measurement beams are subsequently redirected again back to the encoder scale 105 at a second location 904 under non-Littrow conditions, and at oblique angles with respect to the encoder scale 105. Upon reaching the encoder scale, the measurement beams are diffracted a second time into multiple diffraction orders. Again, only a single diffracted beam is shown in FIG. 9 at the second location 904 for purposes of clarity. The twice-diffracted measurement beams (e.g., 901") propagate back to the optical component 900 and then are reflected by the central facet 902 so as to propagate along a direction parallel and opposite to a direction of the input beam 925.

The central facet 902 also is used to derive the reference beam 911. The reference beam 911 (dashed line in FIG. 9) propagates through the component 900 to reference grating 950 where the reference beam is diffracted, at a non-Littrow angle, into multiple diffraction orders (e.g., +1 and −1 diffraction orders) at a first location 906 on the reference grating 950. For clarity, only a single diffracted beam 911' is shown in FIG. 9 at location 906 of the reference gating 950. One or more of the once-diffracted reference beams return to the component 900. Within the optical component 900, the once-diffracted reference beams reflect off the central facet 902 as well as one or more side facets of component 900, until the once-diffracted reference beams are subsequently redirected again back to the reference grating 950 at a second location 907 at a non-Littrow angle.

The measurement beams are diffracted for a second time at the second location 907 of the reference grating 950 into one or more diffraction orders (e.g., +1 or −1 orders). Again, only a single twice-diffracted reference beam 911" is shown in FIG. 9 for clarity. Each twice-diffracted reference beam then propagates through the beam splitting component 900 to combine with a corresponding twice-diffracted measurement beam to form corresponding output beams. The output beams then are received by a detector module (not shown), where the example output beam is shown as beam 960 in FIG. 9. To ensure proper reflection or transmission of the reference and measurement beams at the facets of the components, the facets can be configured to include multilayer coatings for reflecting and/or transmitting incident radiation at specified angles of incidence. In the example shown in FIG. 9, the central facet 902 is configured to act as a beam splitter for radiation incident at 45° with respect to a surface of the facet 902 and to reflect radiation incident at other angles. An example multilayer coating that reflects only 3.2% of a 45° beam and 96.8% of 20° beam (with respect to the interface normal) at a beam splitting surface between two blocks of BK7 glass is the stack ABCBCBCBA, where A is a 78 nm layer of Magnesium Fluoride, B is a 756 nm layer of Zink Sulfide and C is a 365 nm layer of Magnesium Fluoride.

Figure 10:
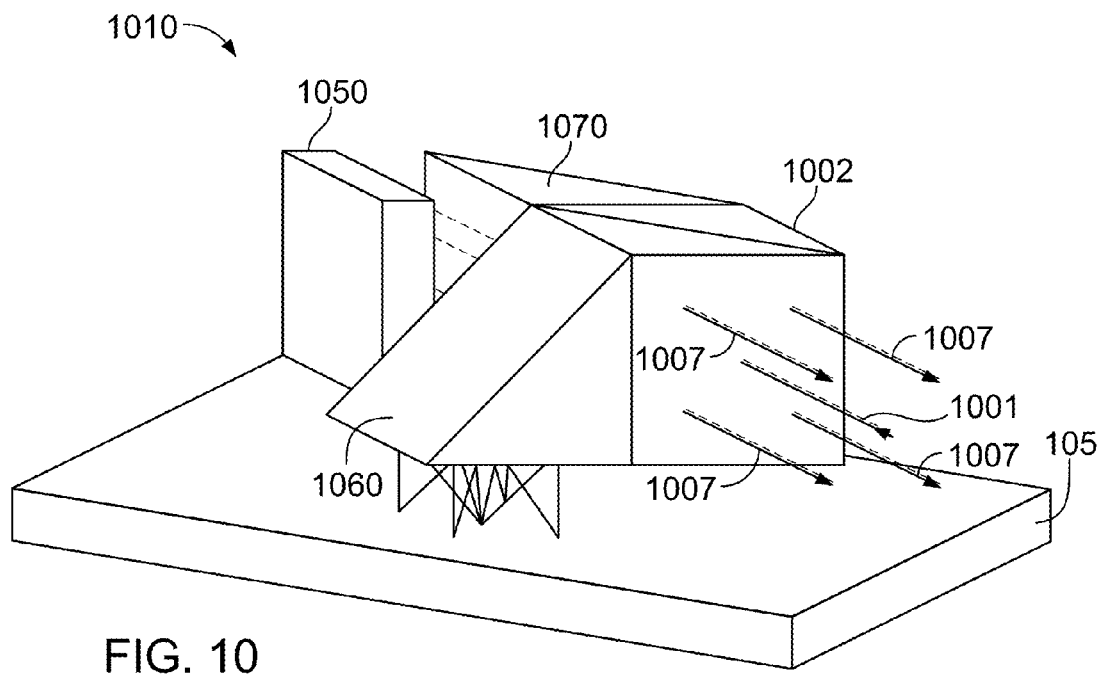
FIG. 10 is a 3D schematic of an example interferometric encoder head.

FIG. 10 shows another embodiment of an encoder head in which a reference grating can be used. In particular, FIG. 10 is a 3D schematic showing an example of an interferometric encoder head 1010 that includes a beam splitter 1002, a reference grating 1050, a measurement block 1060, and a reference block 1070. The measurement block 1060 and reference block 1070 include optical elements such as a right-angled triangular prism and are fixed to the beam splitter 1002 using, for example, an optical adhesive. The beam splitter 1002 can include, for example, a non-polarizing beam-splitter or polarizing beam-splitter. The measurement block 1060 is positioned to direct the measurement beam to and receive once-diffracted and twice-diffracted measurement beams from the encoder scale 105. The reference block 1070 is similarly positioned to send the reference beam to and receive the once-diffracted and twice-diffracted reference beams from the reference grating 1050. The beam splitter 1002 receives an input beam 1001 having orthogonally polarized beam components from an illumination source (not shown) and splits the input beam 1001 into both a reference beam and measurement beam. The reference beam and measurement beam then are redirected by beam splitter 1002 toward the reference block 1070 and measurement block 1060, respectively. Beam splitter 1002 also is configured to combine the twice-diffracted reference beams and twice-diffracted measurement beams into 4 separate output beams 1007 that are sent to a detector module, from which interference signals can be obtained to determine the relative position of the encoder scale and/or the encoder head (e.g., based on phase information from the interference signals).

Figure 11:
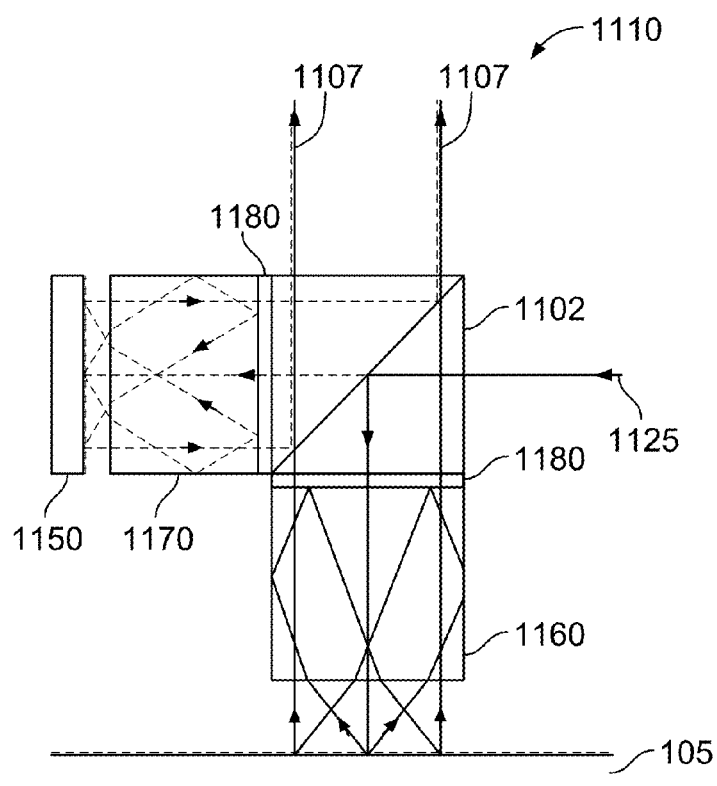
FIG. 11 is a schematic of an example interferometric encoder head.

FIG. 11 is an example of another embodiment of an encoder head that includes a reference grating. In particular, FIG. 11 is a schematic showing a cross-sectional view of an interferometric encoder head 1110 that includes a measurement block 1160 (e.g., a cuboid), a reference block 1170 (e.g., a cuboid), a polarizing beam splitter 1102, a reference grating 1150, and two quarter-waveplates (QWP) 1180.

The operation of the encoder head 1110 is similar to the operation of the encoder head 1010 shown in FIG. 10. That is, the beam splitter 1102 receives an input beam 1125 having orthogonally polarized components and splits the input beam 1125 into a reference beam (dashed line) and measurement beam (solid line), after which the reference beam and measurement beam propagate toward the reference block 1170 and measurement block 1160, respectively.

Initially, the measurement beam passes through the measurement block 1160 and QWP 1180 with little or no reflection and is diffracted by the encoder scale 105 into one or more diffraction orders (e.g., +1, −1 diffraction orders) at a non-Littrow angle. The once-diffracted measurement beams return to the measurement block 1160, where they reflect off side facets of block 1160 back to the encoder scale 105. As in other embodiments described above, measurement block 1160 can include localized thin-film multilayer coatings configured to reflect the once-diffracted measurement beams based on the angle of incidence. The once-diffracted measurement beams return to the encoder scale 105, where the beams are diffracted a second time at non-Littrow angles into one or more diffraction orders. At least some of the twice-diffracted measurement beams propagate back toward the measurement block 1160 along a direction that is parallel to the incident measurement beam.

Similarly, the incident reference beam passes through the reference block 1170 and QWP 1180 with little or no reflection and is diffracted by the reference grating 1150 into one or more diffraction orders (e.g., 1, −1 diffraction orders). The once-diffracted reference beams return to the reference block 1170, where they reflect off side facets of block 1170 back to the reference grating 1150. As in other embodiments described above, reference block 1170 can include localized thin-film multilayer coatings configured to reflect the once-diffracted reference beams based on the angle of incidence. The once-diffracted reference beams return to the reference grating 1150, where the beams are diffracted a second time into one or more diffraction orders. At least some of the twice-diffracted reference beams propagate back toward the reference block 1170 along a direction that is parallel to the incident reference beam. The twice-diffracted reference beams and twice-diffracted measurement beams then are combined in beam splitter 1102 to form output beams 1107, which include phase information related to the optical path length difference between the measurement beams and the reference beams. Using a detector module and electronic processor (not shown), information about one or more relative degrees of freedom of the encoder scale 105 and/or encoder head 1110 can be calculated.

The measurement block 1160 and reference block 1170 do not have to be identically arranged (i.e., being the same distance from beam splitter 1102 and the same distance from each grating) to ensure that the twice-diffracted reference beams and twice-diffracted measurement beams overlap when combined in the beam splitter 1102. For example, in some implementations, the distance between the reference block 1170 and the reference grating 1150 can be different than a distance between the measurement block 1160 and the encoder scale 105. In some implementations, the pitch of a grating on the encoder scale 105 can be different from the pitch on the reference grating 1150. In some implementations, the dimensions of the measurement block 1160 can be different from the dimensions of the reference block 1170. It might, for example, be desirable to have the reference grating 1150 in contact with or at least very close to the reference block 1170 in order to minimize the impact of turbulence. In order to achieve the same offset between input and output beams as in the measurement path, the reference block 1170 dimensions and/or the grating pitch should differ from those used in the measurement path. In addition, the configuration shown in FIG. 11 routes the output beams 1107 along a different direction from the input beam 1125 in order to spatially separate beam delivery and beam pickup.

As noted in the embodiments described above, some surfaces of the monolithic optical components should be configured to allow transmission of beams while other surfaces of the monolithic optical components should be configured to reflect the beams. A surface of the optical component can be made reflective or transmissive to an incident beam at one or more angles by applying a thin-film multilayer coating to the surface.

Figure 12:
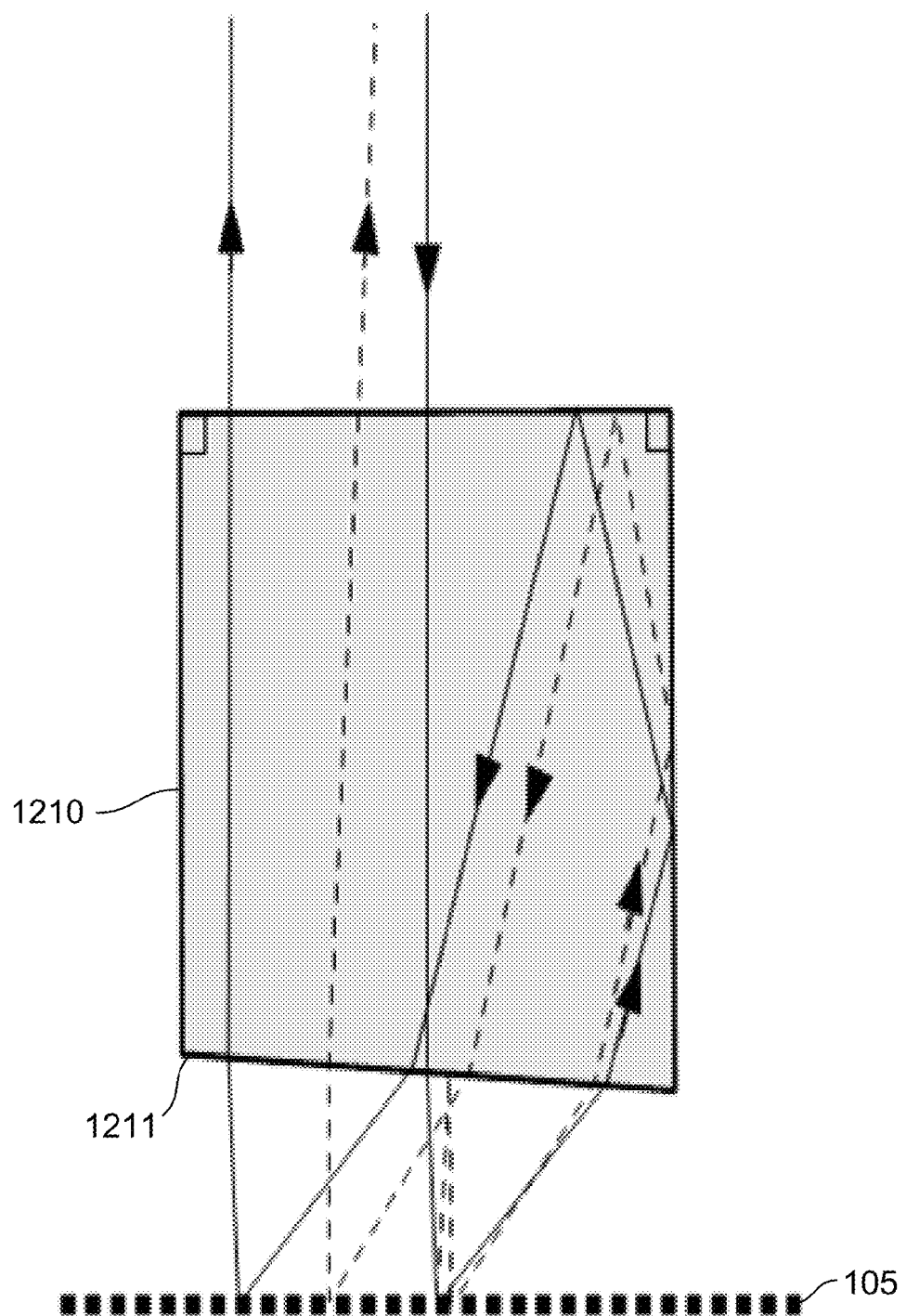
FIG. 12 is a schematic of an example interferometric encoder head.

In some embodiments, the monolithic optical components (e.g., cubes, cuboids and right angle prisms) can be formed to have small angular deviations from the perfect geometrical shapes. The consequent break of symmetry that results from the angular deviations can help reduce errors in detecting the encoder scale position associated with spurious reflections. That is, spurious reflections tend to follow different pathways from the measurement beams and thus do not erroneously modify the detected interference signals. For example, opposite edges of an otherwise symmetric monolithic optical component can deviate from being parallel to one another and/or to a plane of the encoder scale by a small amount such as greater than 0° but less than about 10° (e.g., about 0.5°, about 1°, about 5°, or about 7°) subject to manufacturing tolerances. One such case is illustrated schematically in FIG. 12, where the surface 1211 of a glass monolithic optical component 1210 facing the encoder scale is intentionally tilted with respect to the encoder scale 105 by some amount, e.g. 1°. The solid line shows the intended path of the measurement beam and the two diffraction events. On the other hand, the dashed line represents an unintended spurious beam that is first diffracted in zeroth diffraction order, reflected off the tilted surface 1211, then diffracted again in first diffraction order, roughly following the intended measurement path through the glass monolithic optical component 1210 including retro-reflection, before it is finally diffracted off the grating a third time. Because a direction and location of the spurious beam is different from the desired beam direction and location, measurement errors that would otherwise arise due to the presence of the spurious beam at the detector can be substantially reduced. In contrast, if the bottom surface of the glass monolithic optical component were parallel to the encoder scale, the spurious beam would have the same angle and the same location as the desired measurement beam, leading to additional errors in the position measurement.

Figure 13:
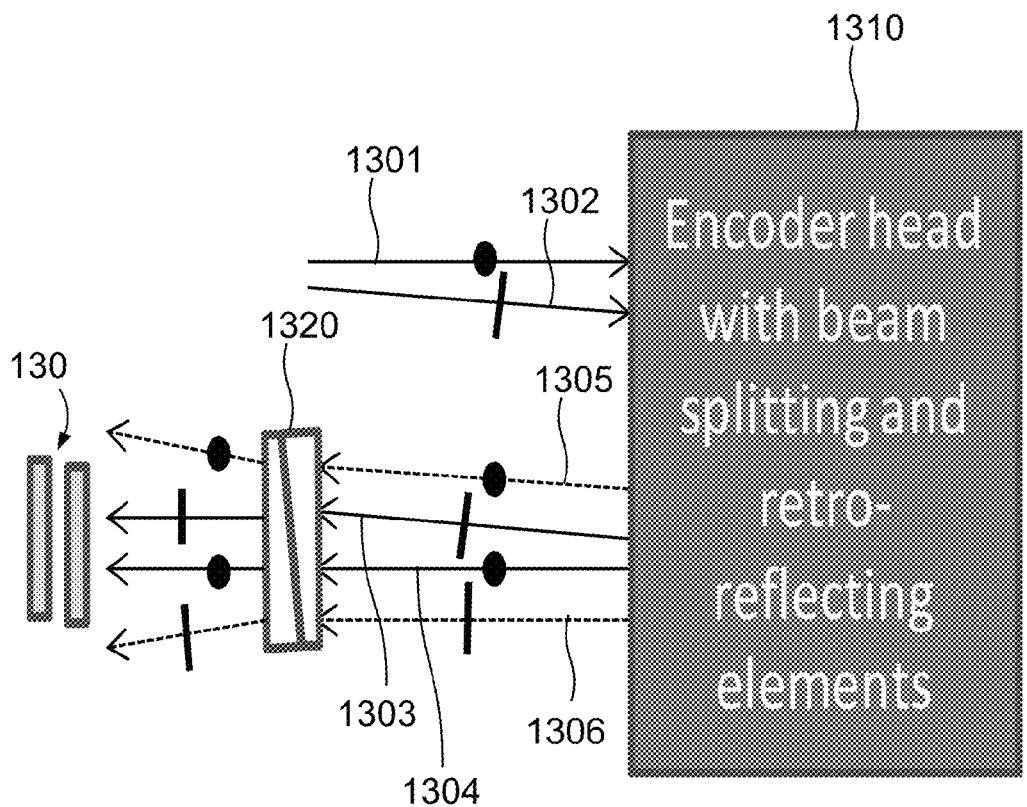
FIG. 13 is a schematic that illustrates an example of using an optical element to separate desired output beams from undesired output beams of an interferometric encoder head.

In some embodiments, the encoder head is configured to cause the measurement and reference beams to propagate with a small angle between one another through the encoder head optics. For example, one or more polarization optical components can be included in the beam path of the measurement and reference beams to impart a small angle separation between the measurement and reference beams (e.g., between about 0.05 mrad and 20 mrad). The small angle separation between the measurement and reference beams allows the beams to be distinguished by their propagation angle in addition to their polarization, thus reducing the magnitude of cyclic errors related to polarization mixing within the encoder head. This is illustrated in FIG. 13, where box 1310 is representative of an encoder head that includes a monolithic optical component and/or beam-splitting and retro-reflective optical elements. The two input beams 1301, 1302 intended as reference and measurement beams, respectively, are mutually orthogonally polarized and are separated by a small angle. The output beams 1303, 1304 from the encoder head still have the same angular separation and mutually orthogonal polarization, but due to potential polarizer leakage in the encoder head, there may be additional unintended output beams 1305, 1306 (i.e., ghost beams) different from the desired output beams 1303, 1304 either in direction or polarization. A birefringent beam combiner 1320 can redirect the intended output beams 1303, 1304 so the beams 1303, 1304 are parallel, whereas the unintended beams 1305, 1306 are deflected by beam combiner 1320 along substantially different directions. Thus, the desired output beams 1303, 1304 can reach a detector module 130 (including, for example a photodetector and polarizer) at the same angle while the undesired beams do either not reach the detector module 130 or lead to substantially reduced interferometric fringe contrast due to the angle with respect to the stronger desired beams. Therefore, the measurement errors due to the presence of the undesired beams at the detector can be eliminated.

In general, any of the analysis methods described above, including determining phase information from detected interference signals and degree of freedom information of the encoder scales, can be implemented in computer hardware or software, or a combination of both. For example, in some embodiments, electronic processor 150 can be installed in a computer and connected to one or more encoder systems and configured to perform analysis of signals from the encoder systems. Analysis can be implemented in computer programs using standard programming techniques following the methods described herein. Program code is applied to input data (e.g., interferometric phase information) to perform the functions described herein and generate output information (e.g., degree of freedom information). The output information is applied to one or more output devices such as a display monitor. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits preprogrammed for that purpose.

Each such computer program is preferably stored on a storage medium or device (e.g., ROM or magnetic diskette) readable by a general or special purpose programmable computer, for configuring and operating the computer when the storage media or device is read by the computer to perform the procedures described herein. The computer program can also reside in cache or main memory during program execution. The analysis methods can also be implemented as a computer-readable storage medium, configured with a computer program, where the storage medium so configured causes a computer to operate in a specific and predefined manner to perform the functions described herein.

Lithography Tool Applications

Lithography tools are especially useful in lithography applications used in fabricating large scale integrated circuits such as computer chips and the like. Lithography is the key technology driver for the semiconductor manufacturing industry. Overlay improvement is one of the five most difficult challenges down to and below 22 nm line widths (design rules), see, for example, the International Technology Roadmap for Semiconductors, pp. 58-59 (2009).

Overlay depends directly on the performance, i.e., accuracy and precision, of the metrology system used to position the wafer and reticle (or mask) stages. Since a lithography tool may produce $50-100M/year of product, the economic value from improved metrology systems is substantial. Each 1% increase in yield of the lithography tool results in approximately $1M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photochemical processes in the resist that convert the radiation pattern into a latent image within the resist.

To properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer. In certain lithography tools, e.g., lithography scanners, the mask is also positioned on a translatable stage that is moved in concert with the wafer during exposure.

Encoder systems, such as those discussed previously, are important components of the positioning mechanisms that control the position of the wafer and reticle, and register the reticle image on the wafer. If such encoder systems include the features described above, the accuracy of distances measured by the systems can be increased and/or maintained over longer periods without offline maintenance, resulting in higher throughput due to increased yields and less tool downtime.

In general, the lithography tool, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which is incorporated herein by reference.

Encoder systems described above can be used to precisely measure the positions of each of the wafer stage and mask stage relative to other components of the exposure system, such as the lens assembly, radiation source, or support structure. In such cases, the encoder system's optical assembly can be attached to a stationary structure and the encoder scale attached to a movable element such as one of the mask and wafer stages. Alternatively, the situation can be reversed, with the optical assembly attached to a movable object and the encoder scale attached to a stationary object.

More generally, such encoder systems can be used to measure the position of any one component of the exposure system relative to any other component of the exposure system, in which the optical assembly is attached to, or supported by, one of the components and the encoder scale is attached, or is supported by the other of the components.

Figure 14:
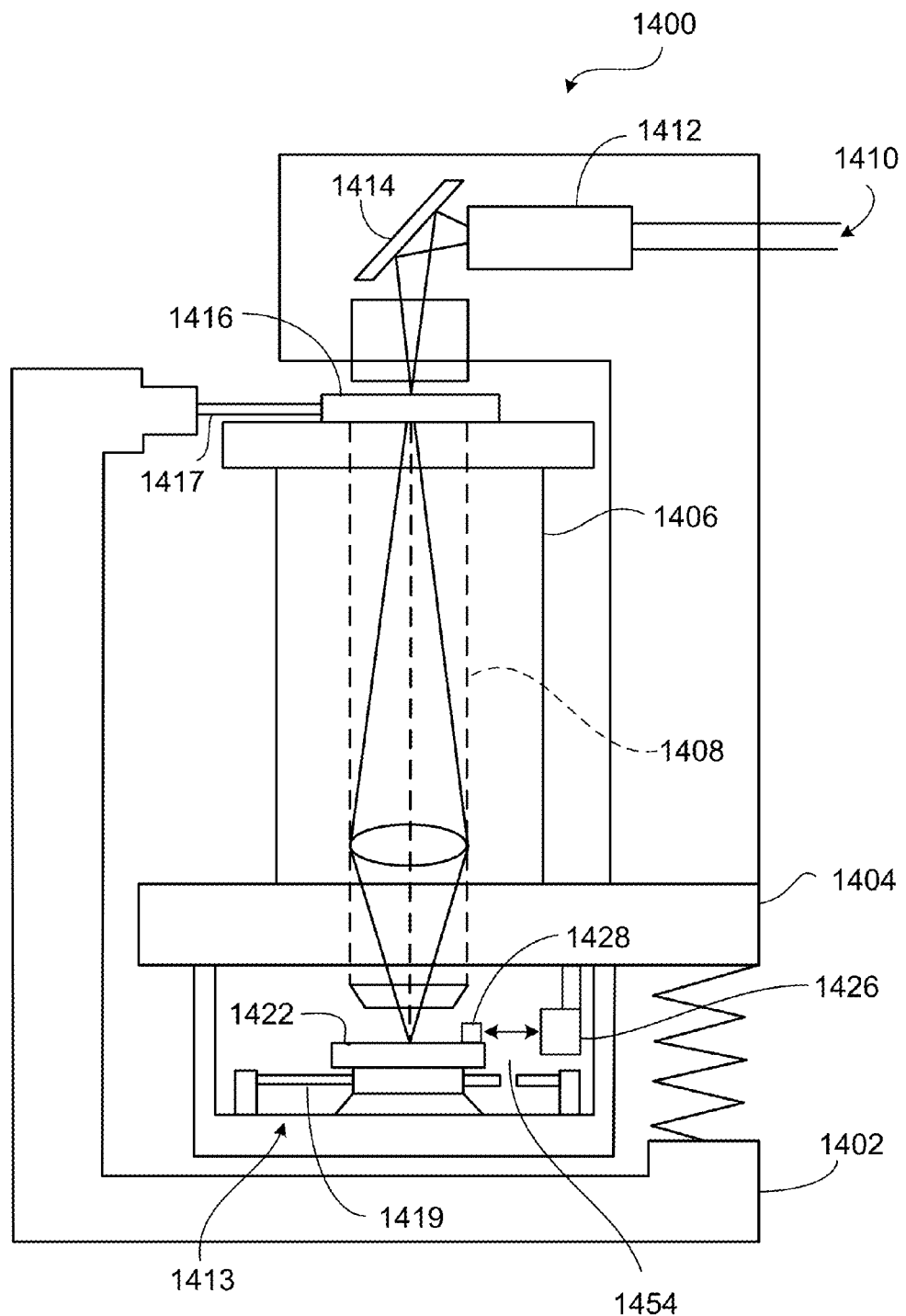
FIG. 14 is a schematic of an example lithography tool.

An example of a lithography tool 1400 using an interferometry system 1426 is shown in FIG. 14. The encoder system is used to precisely measure the position of a wafer (not shown) within an exposure system. Here, stage 1422 is used to position and support the wafer relative to an exposure station. Scanner 1400 includes a frame 1402, which carries other support structures and various components carried on those structures. An exposure base 1404 has mounted on top of it a lens housing 1406 atop of which is mounted a reticle or mask stage 1416, which is used to support a reticle or mask. A positioning system for positioning the mask relative to the exposure station is indicated schematically by element 1417. Positioning system 1417 can include, e.g., piezoelectric transducer elements and corresponding control electronics. Although, it is not included in this described embodiment, one or more of the encoder systems described above can also be used to precisely measure the position of the mask stage as well as other moveable elements whose position must be accurately monitored in processes for fabricating lithographic structures (see supra Sheats and Smith *Microlithography: Science and Technology*).

Suspended below exposure base 1404 is a support base 1413 that carries wafer stage 1422. Stage 1422 includes a measurement object 1428 for diffracting a measurement beam 1454 directed to the stage by optical assembly 1426. A positioning system for positioning stage 1422 relative to optical assembly 1426 is indicated schematically by element 1419. Positioning system 1419 can include, e.g., piezoelectric transducer elements and corresponding control electronics. The measurement object diffracts the measurement beam reflects back to the optical assembly, which is mounted on exposure base 1404. The encoder system can be any of the embodiments described previously.

During operation, a radiation beam 1410, e.g., an ultraviolet (UV) beam from a UV laser (not shown), passes through a beam shaping optics assembly 1412 and travels downward after reflecting from mirror 1414. Thereafter, the radiation beam passes through a mask (not shown) carried by mask stage 1416. The mask (not shown) is imaged onto a wafer (not shown) on wafer stage 1422 via a lens assembly 1408 carried in a lens housing 1406. Base 1404 and the various components supported by it are isolated from environmental vibrations by a damping system depicted by spring 1420.

In some embodiments, one or more of the encoder systems described previously can be used to measure displacement along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In certain embodiments, the optical assembly 1426 can be positioned to measure changes in the position of reticle (or mask) stage 1416 or other movable components of the scanner system. Finally, the encoder systems can be used in a similar fashion with lithography systems involving steppers, in addition to, or rather than, scanners.

Figure 15A:
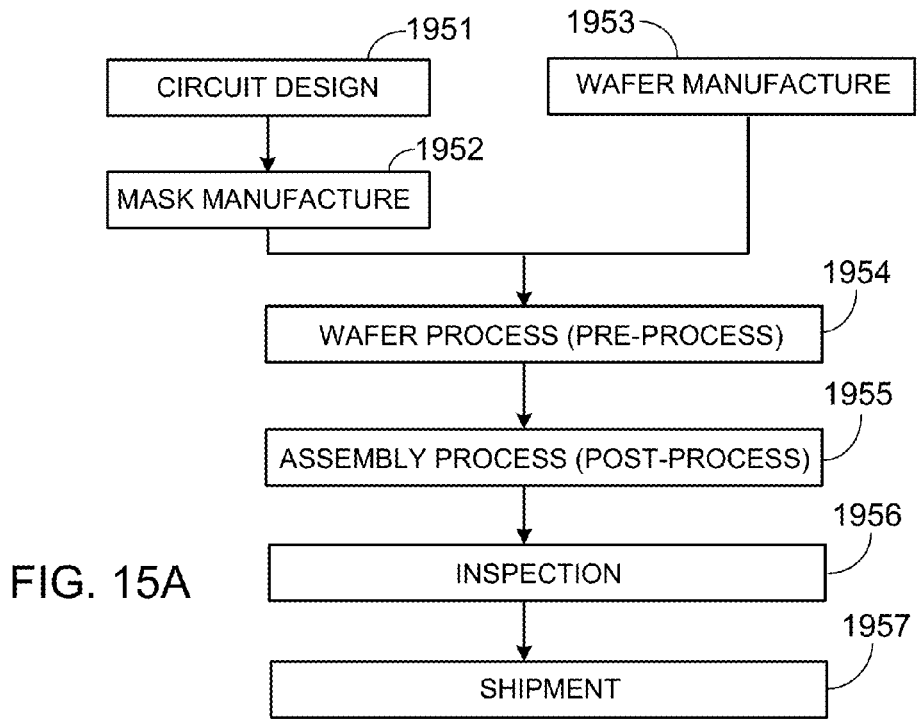
FIG. 15A is a flow chart of a sequence of manufacturing a semiconductor device.

As is well known in the art, lithography is a critical part of manufacturing methods for making semiconducting devices. For example, U.S. Pat. No. 5,483,343 outlines steps for such manufacturing methods. These steps are described below with reference to FIGS. 15A and 15B. FIG. 15A is a flow chart of the sequence of manufacturing a semiconductor device such as a semiconductor chip (e.g., IC or LSI), a liquid crystal panel or a CCD. Step 1951 is a design process for designing the circuit of a semiconductor device. Step 1952 is a process for manufacturing a mask on the basis of the circuit pattern design. Step 1953 is a process for manufacturing a wafer by using a material such as silicon.

Step 1954 is a wafer process that is called a pre-process wherein, by using the so prepared mask and wafer, circuits are formed on the wafer through lithography. To form circuits on the wafer that correspond with sufficient spatial resolution those patterns on the mask, interferometric positioning of the lithography tool relative the wafer is necessary. The interferometry methods and systems described herein can be especially useful to improve the effectiveness of the lithography used in the wafer process.

Step 1955 is an assembling step, which is called a post-process wherein the wafer processed by step 1954 is formed into semiconductor chips. This step includes assembling (dicing and bonding) and packaging (chip sealing). Step 1956 is an inspection step wherein operability check, durability check and so on of the semiconductor devices produced by step 1955 are carried out. With these processes, semiconductor devices are finished and they are shipped (step 1957).

Figure 15B:
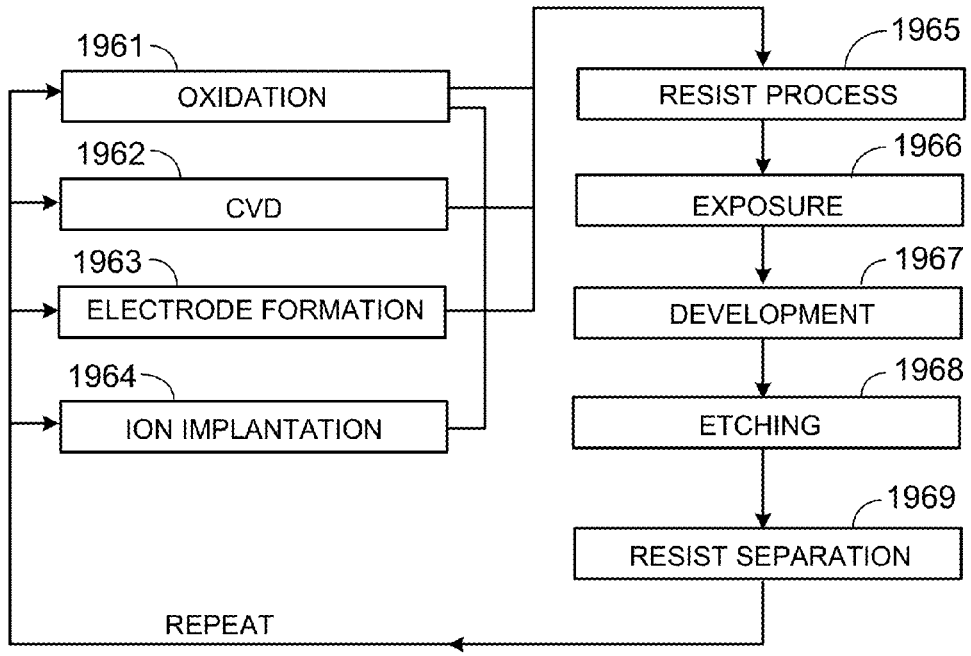
FIG. 15B is a flow chart showing details of a wafer process.

FIG. 15B is a flow chart showing details of the wafer process. Step 1961 is an oxidation process for oxidizing the surface of a wafer. Step 1962 is a CVD process for forming an insulating film on the wafer surface. Step 1963 is an electrode forming process for forming electrodes on the wafer by vapor deposition. Step 1964 is an ion implanting process for implanting ions to the wafer. Step 1965 is a resist process for applying a resist (photosensitive material) to the wafer. Step 1966 is an exposure process for printing, by exposure (i.e., lithography), the circuit pattern of the mask on the wafer through the exposure apparatus described above. Once again, as described above, the use of the interferometry systems and methods described herein improve the accuracy and resolution of such lithography steps.

Step 1967 is a developing process for developing the exposed wafer. Step 1968 is an etching process for removing portions other than the developed resist image. Step 1969 is a resist separation process for separating the resist material remaining on the wafer after being subjected to the etching process. By repeating these processes, circuit patterns are formed and superimposed on the wafer.

The encoder systems described above can also be used in other applications in which the relative position of an object needs to be measured precisely. For example, in applications in which a write beam such as a laser, x-ray, ion, or electron beam, marks a pattern onto a substrate as either the substrate or beam moves, the encoder systems can be used to measure the relative movement between the substrate and write beam.

A number of embodiments have been described. Nevertheless, it will be understood that various modifications may be made. For example, in some embodiments, the monolithic optical component includes additional beam steering elements (e.g., gratings and/or refractive wedges) integrally formed with the component, where the beam steering elements provide additional flexibility for directing beams to more desirable locations. Alternatively, or in addition, the additional beam steering elements that are integrally formed with the monolithic optical component may enable beam geometries that make the interferometric encoder system inherently less sensitive to variations in encoder scale position.

FIG. 16 shows examples of encoder heads that use patches of transmission and reflection gratings integrally formed with a monolithic optical component to provide a beam geometry that is less sensitive to variations in encoder scale position.

Figure 16C:
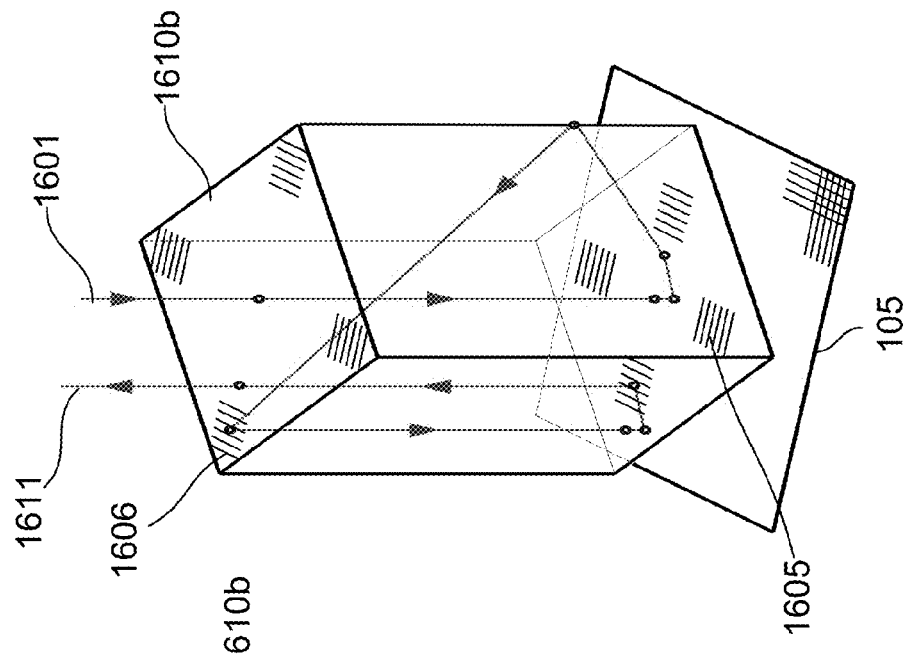
FIG. 16C is a 3D schematic of the encoder head shown in FIG. 16B.
Figure 16B:
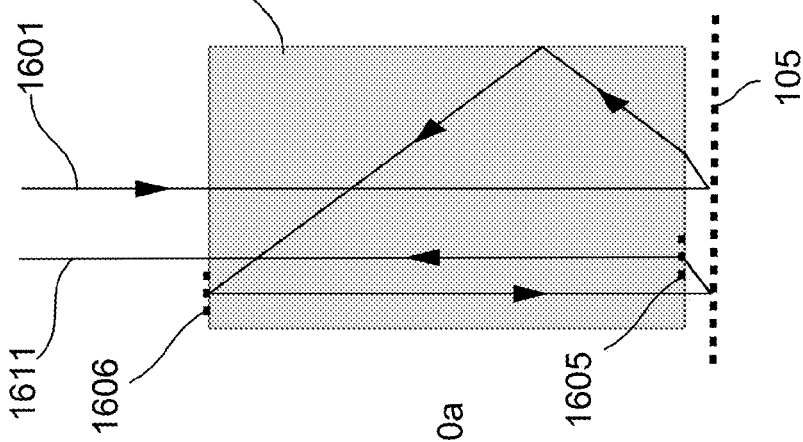
FIG. 16B is a schematic that illustrates an example of an encoder head that uses patches of transmission and reflection gratings.
Figure 16A:
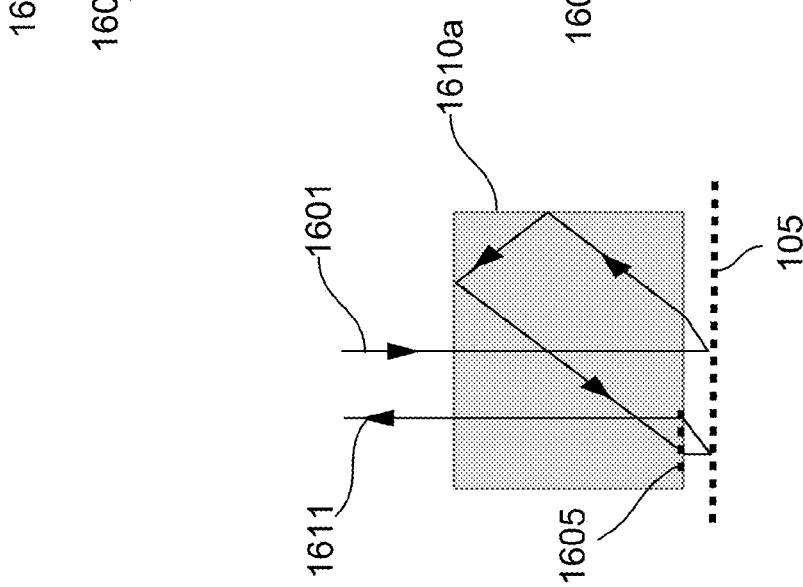
FIG. 16A is a schematic that illustrates an example of an encoder head that uses patches of transmission and reflection gratings.

FIG. 16A is a schematic of a cross-section showing the beam path of only one measurement beam 1601 out of up to four measurement beams that are guided by the monolithic optical component 1610a (e.g., a cuboid) toward a two-dimensional (2D) encoder scale (e.g., 2D grating) 105. After diffraction off the encoder scale 105, the beam 1601 reenters component 1610 and is retro-reflected off two side facets and a top facet of the component 1610a before reaching a patch of a transmission grating 1605 integrally formed in the component 1610a. The grating 1605 redirects the once-diffracted beam at a near-normal angle to the encoder scale 105. The measurement beam is diffracted a second time from the encoder scale 105. The now twice-diffracted measurement beam, which can be, for example, of the same order of diffraction as the once-diffracted beam (e.g., +1 diffraction order), is redirected by the transmission grating patch 1605 along a direction (beam 1611) opposite to the initial incoming beam.

FIG. 16B is a configuration of an encoder head similar to FIG. 16A, in which a reflection grating 1606 on a top facet of a monolithic optical component 1610b (e.g., a cuboid) provides retro-reflection of a once-diffracted measurement beam, such that the once-diffracted measurement beam is directed toward the encoder scale 105. As shown in FIG. 16B, the reflection grating 1606 is laterally offset from the transmission grating 1605 to allow the once-diffracted measurement beam to pass through the bottom facet of the component 1610b without modifying the beam path. The twice-diffracted beam is then redirected by transmission grating 1605 along a path (e.g., beam 1611) that is parallel to and in the opposite direction of the incident measurement beam 1601.

FIG. 16C is a 3D representation of the encoder shown in FIG. 16B, again with only one measurement beam path shown. As shown in FIG. 16C, the edges of component 1610b are not oriented parallel to the encoder grating grooves. This arrangement enables the diffracted beams to be incident at the intersection of two side facets as well as at a top facet of component 1610b.

Other embodiments are within the scope of the claims.

What is claimed is:

1. An encoder system comprising:
    an encoder head, the encoder head being configured to direct light to an encoder scale to produce a plurality of twice-diffracted measurement beams and to combine each twice-diffracted measurement beam of the plurality of twice-diffracted measurement beams with a corresponding reference beam to form a plurality of output beams,
    wherein the encoder head comprises a monolithic optical component having a plurality of facets, the plurality of facets being arranged to:

receive a plurality of once-diffracted measurement beams from a surface of the encoder scale; and redirect the plurality of once-diffracted measurement beams back towards the surface of the encoder scale, the encoder scale being positioned in a path of the once-diffracted measurement beams to produce the twice-diffracted measurement beams, wherein the twice-diffracted measurement beams do not satisfy the Littrow condition with respect to the encoder scale; and a plurality of detector elements, each detector positioned to detect a corresponding output beam; and an electronic processor configured to:
receive an interference signal from each of the detector elements, each interference signal comprising a phase related to an optical path difference between one of the twice-diffracted measurement beams and the corresponding reference beam; and determine information about a degree of freedom of the encoder scale based on the phase for each interference signal.

2. The encoder system of claim 1, wherein the monolithic optical component has a cube shape.

3. The encoder system of claim 1, wherein the monolithic optical component has a rectangular parallelepiped shape.

4. The encoder system of claim 1, wherein the monolithic optical component comprises a first facet arranged to receive a non-diffracted measurement beam and to emit the twice-diffracted measurement beams, the first facet being substantially transparent to radiation propagating in a direction normal to the first facet, and being substantially reflective to radiation incident at oblique angles with respect to the first facet.

5. The encoder system of claim 4, wherein the monolithic optical component comprises a second facet arranged to receive a once-diffracted or twice-diffracted measurement beam from the encoder scale, the second facet being substantially transparent to radiation propagating in a direction normal to the second facet.

6. The encoder system of claim 5, wherein the second facet is arranged across from and facing the first facet.

7. The encoder system of claim 5, wherein the second facet is arranged orthogonal to the first facet.

8. The encoder system of claim 7, wherein the second facet is configured to:
reflect radiation incident on the second facet at a first range of oblique angles with respect to the second facet; and
transmit radiation incident on the second facet at a second different range of oblique angles with respect to the second facet.

9. The encoder system of claim 4, wherein a side facet of the monolithic optical component is substantially reflective to radiation incident at oblique angles with respect to the side facet.

10. The encoder system of claim 1, wherein the encoder scale comprises a 1D or 2D grating, the grating being composed of grooves extending along a first direction.

11. The encoder system of claim 10, wherein a plane including a side facet of the monolithic optical component is oriented at an oblique angle with respect to the first direction.

12. The encoder system of claim 1, wherein the monolithic optical component is a hexagonal prism.

13. The encoder system of claim 1, wherein the encoder head is configured to direct a non-diffracted measurement along a first beam path toward the encoder scale, the first beam path of the non-diffracted measurement beam being outside of the monolithic optical component.

14. The encoder system of claim 13, wherein the encoder scale is positioned with respect to the monolithic optical component to diffract an incident beam along a second beam path, the second beam path of the diffracted incident beam being outside of the monolithic optical component.

15. The encoder system of claim 14, wherein the incident beam comprises one of the once-diffracted measurement beams.

16. The encoder system of claim 1, wherein the monolithic optical component comprises a pentagonal prism.

17. The encoder system of claim 1, wherein the once-diffracted measurement beams comprise a first once-diffracted measurement beam that results from a positive order of diffraction from the encoder scale and a second once-diffracted measurement beam that results from a negative order of diffraction from the encoder scale.

18. The encoder of claim 17, wherein the first and second once-diffracted measurement beams result from positive and negative orders of diffraction along a first direction, and the once-diffracted measurement beams further comprise a third and fourth once-diffracted measurement beams that results from a positive order and a negative order of diffraction from the encoder scale, respectively, along a second orthogonal direction.

19. The encoder system of claim 1, further comprising a plurality of optical elements configured to:
receive an input beam; and
derive, from the input beam, (1) the corresponding reference beam for each twice-diffracted measurement beam and (2) an incident measurement beam.

20. The encoder system of claim 19, wherein the plurality of optical elements comprise:
a plurality of beam splitters; and
a retro-reflector.

21. The encoder system of claim 1, wherein the monolithic optical component is configured to:
receive an input beam; and
derive, from the input beam, (1) the corresponding reference beam for each twice-diffracted measurement beam and (2) an incident measurement beam.

22. The encoder system of claim 21, wherein the monolithic optical component comprises a beam splitting facet configured to:
split the input beam based on a polarization of the input beam and based on a specified angle of incidence with respect to the beam splitting facet; and
reflect beams incident on the beam splitting facet at angles of incidence other than the specified angle of incident.

23. The encoder system of claim 22, further comprising a reference grating positioned to:
receive the reference beams from the monolithic optical component; and
redirect diffracted reference beams to the monolithic optical component.

24. A system comprising:
a moveable stage; and the encoder system of claim 1, wherein either the encoder system or the encoder scale is attached to the moveable stage.

25. A lithography system comprising:
the encoder system of claim 1;
a moveable stage, wherein either the encoder system or the encoder scale is attached to the moveable stage;
an illumination system including a radiation source, wherein during operation of the lithography system, the radiation source directs radiation to an object supported by the moveable stage;
and
a positioning system coupled to the electronic processor of the encoder system and configured to adjust a position of the stage based on the information about the degree of freedom of the encoder scale.

26. An encoder head for use with an encoder scale, the encoder head being configured to combine each twice-diffracted measurement beam of a plurality of twice-diffracted measurement beams with a corresponding reference beam to form a plurality of output beams,
    wherein the encoder head comprises a monolithic optical component having a plurality of facets, the plurality of facets being arranged to:
      i) receive a plurality of once-diffracted measurement beams from a surface of the encoder scale; and
      ii) redirect the plurality of once-diffracted measurement beams back towards the surface of the encoder scale, the encoder scale being positioned in a path of the once-diffracted measurement beams to produce the twice-diffracted measurement beams, wherein the twice-diffracted measurement beams do not satisfy the Littrow condition with respect to the encoder scale.

27. The encoder system of claim 1, wherein a first edge of the monolithic optical component and a second opposite edge of the monolithic optical component deviate from being parallel by less than about 10°.

28. The encoder system of claim 1, wherein the plurality of once-diffracted measurement beams are derived from a single non-diffracted measurement beam.

29. The encoder head of claim 26, wherein the plurality of once-diffracted measurement beams are derived from a single non-diffracted measurement beam.

30. The encoder system of claim 1, wherein the plurality of once-diffracted measurement beams do not satisfy the Littrow condition with respect to the encoder scale.

31. The encoder head of claim 26, wherein the plurality of once-diffracted measurement beams do not satisfy the Littrow condition with respect to the encoder scale.

* * * * *